United States Patent [19]
Jacobs

[11] Patent Number: 4,804,251
[45] Date of Patent: Feb. 14, 1989

[54] ELECTRODE STRUCTURES AND ELECTROOPTIC LIGHT GATE SYSTEMS

[75] Inventor: John H. Jacobs, Altadena, Calif.

[73] Assignee: Imo DeLaval Inc., Lawrenceville, N.J.

[21] Appl. No.: 282,554

[22] Filed: Jul. 13, 1981

Related U.S. Application Data

[63] Continuation of Ser. No. 34,871, Apr. 30, 1979, abandoned, which is a continuation-in-part of Ser. No. 776,157, Mar. 10, 1977, abandoned.

[51] Int. Cl.$^4$ .............................................. G02F 1/133
[52] U.S. Cl. .................................... 350/392; 340/784; 350/336; 350/356
[58] Field of Search .................. 350/336, 356, 96, 14, 350/392; 310/366; 358/241; 361/393, 395, 404, 416, 425; 250/578; 365/231, 108–109, 215, 234–235; 340/166 FE, 752, 783–784

[56] References Cited

U.S. PATENT DOCUMENTS

| | | | |
|---|---|---|---|
| 3,023,406 | 2/1962 | Jones | 250/208 |
| 3,124,635 | 3/1964 | Jones et al. | 250/578 |
| 3,449,038 | 6/1969 | Scarrott | 350/392 |
| 3,452,342 | 6/1969 | Raffel | 361/416 |
| 3,531,182 | 9/1970 | Land et al. . | |
| 3,555,454 | 1/1971 | Myers et al. | 350/392 |
| 3,744,875 | 7/1973 | Haertling et al. . | |
| 3,868,608 | 2/1975 | Williams | 350/392 |
| 3,930,119 | 12/1975 | Schmidt et al. . | |

FOREIGN PATENT DOCUMENTS 1261738  1/1972  United Kingdom ................. 350/392

OTHER PUBLICATIONS

Pender et al, eds., *Handbook for Electrical Engineers*, 2nd Edition, New York, John Wiley and Sons, 1922, pp. 1103–1105.

Zook, "Light Beam Deflection Performance: A Comparative Analysis," *Applied Optics*, vol. 13, No. 4, Apr. 1974, pp. 875–887.

Cutchen et al, "Electrooptic Devices Utilizing Quadratic PLZT Ceramic Elements," *Western Electronic Show and Convention*, San Francisco, Sep. 11–14, 1973, vol. 17, No. 30, pp. 1–12.

"Bold Leap to New Technology," *Machine Design*, Sep. 6, 1979, pp. 86–87.

"Product of the Year Awards," *Electronic Products*, Jan. 1980, pp. 33–34.

Morris, "I-R 100 Winners Consist of Many Control Products," *Control Engineering*, Oct. 1980, p. 4.

Gilmore, W. F., "Printed Circuit Generator", IBM Tech. Disc. Bull., 12–1969, pp. 922.

Cutchen et al, "PLZT Electrooptic Shutters: Applications", App. Optics, 8–1975, pp. 1866–1873.

*Primary Examiner*—John K. Corbin
*Assistant Examiner*—Martin Lerner
*Attorney, Agent, or Firm*—Benoit Law Corporation

[57] ABSTRACT

An article of manufacture, such as an electrically actuable light gate structure, includes a substrate which may comprise an electrooptically active solid-state light gate material. Spaced parallel electrodes are subdivided on that substrate into first and second electrode arrays alternating along an elongate region of the substrate. Individual terminals for the electrodes in each first electrode array are distributed along a line on one side of the elongate region, and individual terminals for the electrodes in each second electrode array are distributed along a line on the opposite side of the elongate region of the substrate. Any individual terminal of any one of the electrodes is spaced from the individual terminal of any other electrode by a center-to-center distance greater than the center-to-center spacing between that one electrode and the latter other electrode.

53 Claims, 5 Drawing Sheets

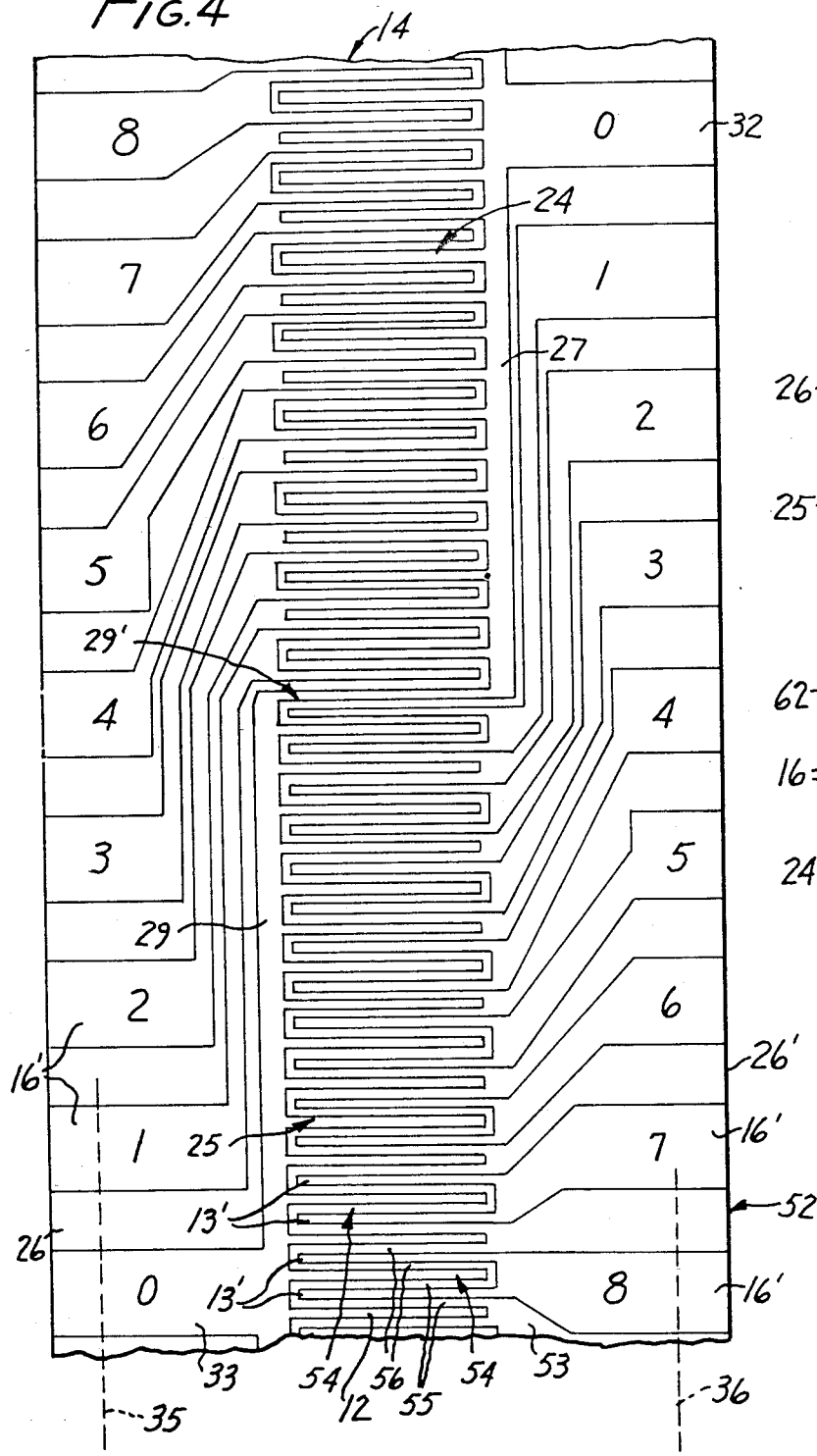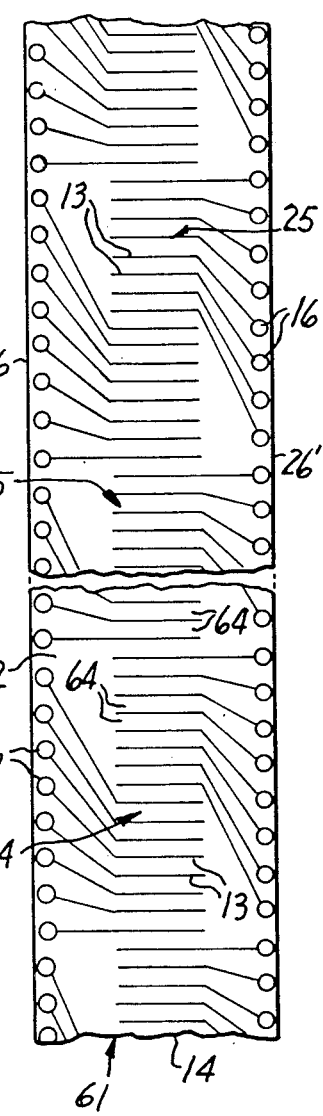

ELECTRODE STRUCTURES AND ELECTROOPTIC LIGHT GATE SYSTEMS

CROSS-REFERENCE

This is a continuation-in-part of Application Ser. No. 776,157, a continuation of application Ser. No. 06/034,871, filed Apr. 30, 1979, now abandoned, for Electrode Structures and Electrooptic Light Gate Systems, which was filed by the subject inventor on Mar. 10, 1977 for Light Gate Utilization Methods and Apparatus, assigned to the subject assignee and herewith incorporated by reference herein.

BACKGROUND OF THE INVENTION

1. Field of the Invention

The subject invention relates to electrical circuitry and electrooptical systems and, more specifically, to electrode structures, solid-state light gate structures, preformed panel circuit arrangements and similar articles of manufacture, methods of increasing feasible electrode density in electrode structures, methods of providing electrically switchable light gate structures, and light gate utilization methods and apparatus.

2. Disclosure Statement

This disclosure statement is made persuant to the duty of disclosure imposed by law and formulated in 37 CRF 1.56(a). No representation is hereby made that information thus disclosed in fact constitutes prior art, inasmuch as 37 CFR 1.56(a) relies on a materiality concept which depends on uncertain and inevitably subjective elements of substantial likelihood and reasonableness, and inasmuch as a growing attitude appears to require citation of material which might lead to a discovery of pertinent material.

A feasibility of dense electrode arrys is fundamental to a provision or improvement of many electrooptical systems and various other apparatus. In particular, there are many areas of utility wheren spaced parallel electrodes, or interdigitated first and second electrodes, require an individual electrical connection at least to each electrode of the same kind.

Reference may, in this connection, be had to U.S. Pat. No. 3,124,635, by E. M. Jones et al, issued Mar. 10, 1964 and U.S. Pat. No. 4,010,376, by Sherman W. Duck, issued Mar. 1, 1977.

As to nature and utility of prior-art electrode devices, reference may also be had to U.S. Pat. Nos. 2,670,402, 2,836,766, 2,883,582, 2,898,489, 2,909,973, 2,928,993, 2,972,076, 2,988,647, 2,996,623, 3,069,973, 3,078,373, 3,082,327, 3,087,087, 3,087,985, 3,121,861, 3,137,762, 3,173,745, 3,220,012, 3,221,335, 3,265,928, 3,288,602, 3,312,825, 3,318,997, 3,341,692, 3,369,251, 3,400,382, 3,437,815, 3,449,038, 3,512,158, 3,540,427, 3,704,512, 3,732,424, 3,873,187 and 3,955,190, as well as to the article by Louis Mirando et al, entitled Flat Screen Television Takes Two Giant Steps Forward, ELECTRONICS, May 25, 1970, pp. 112 et seq.

An interesting proposal has been advanced by Mohan in U.S. Pat. No. 3,084,301, issued Apr. 2, 1963 in connection with an electrode structure for a scanning apparatus. Briefly, Mohan, in one embodiment, provides a common electrode in a serpentine or square-wave fashion between interdigitated first and second electrodes connected to opposite poles of a direct-current source.

Unfortunately, as Mohan himself points out, this in practice leads to a keystoning effect in the output amplitude of the switched current. The remedy proposed by Mohan, namely the provision of several parallel leads or terminals in place of a single common electrode terminal would largely neutralize an advantage that might be gained by using the Mohan electrode configuration. Also, the serpentine electrode meandering between opposite interdigitated electrodes provides a high reactance, notably a high inductance which diminishes the value of the structure as a switching device.

The need for high-density switching electrode structures has intensified with the development of electrooptical light gate systems in light modulators and other equipment as has been disclosed in U.S. Pat. Nos. 2,591,701, 3,027,806, 3,322,485, 3,354,465, 3,454,771, 3,464,762, 3,471,863, 3,492,492, 3,499,702, 3,499,704, 3,512,864, 3,567,847, 3,582,957, 3,597,044, 3,612,656, 3,624,597, 3,644,017, 3,657,471, 3,657,707, 3,666,666, 3,699,242, 3,702,724, 3,718,723, 3,737,211, 3,781,783, 3,787,111, 3,799,647, 3,823,998, 3,867,571, 3,914,546, 3,922,485, 3,926,520, 3,930,119, 3,944,323 and 3,945,715. For information on electro-optical oscillographs and facsimile equipment, reference may also be had to German Pats. Nos. 357 299, issued Aug. 19, 1922, 492 331, issued Mar. 5, 1930 and 584 384, issued Sep. 19, 1933 and to German published Patent Applications Nos. 2 321 870, published Nov. 7, 1974 and 2 322 473, published Nov. 21, 1974.

While the familiar Kerr cell naturally was spawned a multitude of proposals built on the light modulating capability of that cell, a more recent impetus in that direction has emanated from the advent of suitable light-modulating solid state materials as may be seen from U.S. Pat. Nos. 2,892,955, 2,911,370, 2,985,700, 4,144,411, 3,283,044, 3,303,133, 3,344,073, 3,429,818, 3,434,122, 3,464,924, 3,517,093, 3,531,182, 3,532,628, 3,536,625, 3,622,226, 3,630,597, 3,684,714, 3,699,044, 3,708,438, 3,728,263, 3,732,117, 3,744,875, 3,816,750, 3,826,865, 3,856,693, 3,871,745, 3,903,358, 3,917,780, 3,923,675, 3,932,313, 3,938,878 and 3,963,630 and U.S. published patent application B No. 384,225, dated Mar. 16, 1976.

A family of ferroelectric electro-optic ceramics is known as PZT compounds with P standing for lead, Z for zirconium and T for titanium. Under the influence of an electrical field, PZT compounds become birefringent and exhibit various electrooptic properties. For instance, incoming light is resolved into two component waves propagating at different velocities and in polarization planes that are at right angles to each other. The magnitude of the effect is a function of the applied voltage and of the light frequency. Light valves and gates may be provided by placing the electrooptic ceramic between a polarizer plate and an analyzer plate.

A breakthrough occurred with the discovery that substitution of small amounts of lanthanum greatly improves ferroelectric properties. These improved compounds generally have become known as PLZT compounds, with the L standing for lanthanum.

Reference may in this respect to had to Land et al, Ferroelectric Ceramic Electrooptic Materials and Devices, 57 Proceedings IEEE No. 5, May 1969, pp. 751 and 768, Thacher et al, Ferroelectric Electrooptic Ceramics with Reduced Scattering, Ed-16, IEEE Transactions on Electron Devices, No. 6, June 1969, pp. 515 to 521, Maldonado et al, Ferroelectric Ceramic Light Gates Operated in a Voltage-Controlled Mode, ED-17, IEEE Transactions on Electron Devices, No. 2, February 1970, pp. 148 to 157, New Ferroelectric Ceramics Enhance Electro-Optic Performance, Design News, June 22, 1970, pp. 10 and 11, Haertling et al, Hot-Pressed (Pb, La) (Zr, Ti) $O_3$ Ferroelectric Ceramics for Electrooptic Applications, 54 Journal of The American Ceramic Society, No. 1, January 1971, pp. 1 to 11, Waterworth et al, Integrated Electro-Optic Modulator Arrays, 4 Opto-elctronics (1972) 339 and 340, Cutchen et al, Electrooptic Devices Utilizing Quadratic PLZT Ceramic Elements, 30, 1973, Wescon Technical Papers, Vol. 17 pp. 1 to 12, Zook, Light Beam Deflector Performance: a Comparative Analysis, 13 APPLIED OPTICS, No. 4, April 1974, pp. 875 et seq., Fiber Display Features Digital Scanning, Optical Spectra, June 1974, and Cutchen et al, PLZT Electrooptic Shutters: Applications, 14 APPLIED OPTICS, No. 8, August 1975, pp. 1866 to 1873.

In the course of such development, devices such as Kerr cells in such applications as constant-density trace oscillographs disclosed in U.S. Pat. No. 3,354,465 by Merrit et al, issued Nov. 21, 1967, were replaced by solid-state light valves. Indeed, solid-state shutter systems were among the first practical applications as may, for instance, be seen from U.S. Pat. No. 3,555,987, by Iben Browning, issued Jan. 19, 1974. The switching properties and modes of ferroelectric ceramic plates were recognized and published such as in the above mentioned 1969 IEEE article by Land et al, pp. 61 and 762 and FIG. 20, and proposals for practical applications such as those suggested in the above mentioned U.S. Pat. No. 3,930,119, by Schmidt et al, issued Dec. 30, 1975, naturally followed.

In particular Schmidt et al propose in all their electrode structure embodiments attachment of the electric voltage-applying leads to the electrodes themselves. In this respect, reference may be had to the article by J. Thomas Cutchen et al, entitled Electrooptic Devices Utilizing Quadratic PLZT Ceramic Elements, published in 1973 WESCON Technical Papers, Vol. 17, Pt. 30/2, pp. 1 to 12. This publication in FIG. 19 shows dual aperture gate and single aperture gate structures and on page 10 mentions electrode widths of 0.001 to 0.003 inches and gap or gate widths between adjacent electrode pairs of 0.0015 to 0.002 inches, in PLZT devices.

With such an electrode structure, implementation of the above mentioned Schmidt et al disclosure would require wire sizes of 0.001 inch in diameter or less and bonding techniques which do not require more lateral space or do not leave a wider deposit than the diameter of the wire itself.

This in practice would require use of a wire of 0.001 inch in diameter or less, applied to each electrode by a special technique, such as wedge bonding, for the 0.001 electrode width.

With the dimensions given above, the center-to-center distances between the electrode terminals would have to be 0.005 inches, providing 200 gates per inch which would require 200 wires per inch to be individually bonded to electrode terminals. This is in line with Schmidt et al who mention 800 picture elements per line across a DIN A4 format paper.

In practice, such wire and terminal densities would be difficult enough to implement just in view of the requisite small wire size itself. However, the problem is greatly aggravated by the fact that every wire feeding or bonding tool inevitably has lateral dimensions exceeding significantly the wire diameter. This so far has precluded a practical implementation of the Schmidt et al and Cutchen proposals.

For a realization of such and similar proposals, a further hurdle that would have to be overcome stems from the widespread necessity of having to interface light gate structures or electrode arrangements with appropriate circuitry for driving the light gate or electrode system. In this respect, the best connecting system would be one in which the wires or leads run parallel to each other from the light gate or electrode structure to the driving circuit boards. This would at least tend to avoid the difficulty of having to provide and install insulated wires, or to insulate installed wires, having a diameter on the order of 0.001 inch or less.

For connecting wires to run parallel to each other, line densities on the driving circuit board side becomes similar to the requisite prior-art high terminal densities on the light gate or electrode structure side. This, in turn, would create considerable difficulties, since circuit boards still are typically made by thick film techniques which do not permit the line width and close electrode spacing achievable by thin film techniques. In consequence, more complex and expensive multilayer structures would have to be resorted to at the driving circuit boards.

No effective solution of these problems is offered in the available patent or other literature. For instance, the above mentioned Jones et al U.S. Pat. No. 3,124,635, like Schmidt et al, discloses electrode terminals of a center-to-center spacing no larger than the spacing between adjacent electrodes. In particular, Jones et al fail to gain any contact area or terminal spacing from their manner of locating their electrode terminals.

Raffel in U.S. Pat. No. 3,452,342 achieves center-to-center distances between adjacent terminals greater than the center-to-center spacing between corresponding electrodes connected to such terminals. In particular, Raffel achieves such an advantage by clustering or nesting terminals belonging to a given electrode array and by alternatingly providing terminals on opposite sides of the electrode arrays. This clustering or nesting, however, has the severe disadvantage in practice of necessitating a multitude of detrimental crossovers between terminals and connecting wires.

For instance, a wire lead connecting one of the innermost terminals of Raffel to appropriate energizing or driving circuitry would have to cross over a minimum of two other terminals. This, in practice, not only encumbers the job of establishing the requisite connections between the clustered terminals and the driving circuitry, but also creates a danger of faulty performance from unintended electrical contact of, or leakage between, crossing leads or leads crossing terminals.

The gravity of such problems can, for instance, be appreciated from a consideration of the Scarrott U.S. Pat. No. 3,449,038, requiring the provision of a multitude of connecting lead cross-overs for an implementation of its illustrated preferred embodiment.

Another article by J. Thomas Cutchen et al, entitled PLZT Electrooptic Shutters: Applications, published in APPLIED OPTICS, Vol. 14, No. 8 (August 1975), pp. 1866 et al, proposes in FIG. 2 an arrangement of terminals of alternate electrodes on opposite sides of the electrode array. This, indeed, would appear to double the achievable center-to-center distance between adjacent terminals relative to their corresponding electrodes. However, since suitable available driving circuitry typically is packaged or provided in terms of binary systems, in which driving transistors and similar components are grouped according to a power on the base of two, such as $2^3$, this Cutchen proposal would be rather impractical in its attempted implementation.

A somewhat related problem that has plagued the development of electrooptical solid-state light gate structures stems from the rather high voltages required to achieve rapid and reliable switching of the solid-state light gates. In this respect, both of the above mentioned Cutchen et al articles provide on a PLZT electrooptic ceramic substrate a plurality of interdigitated first and second electrodes and further provide a first common terminal interconnecting all first electrodes and a second common terminal interconnecting all second electrodes. All interconnected first and second electrodes are then simultaneously driven via the common first and second terminals. However, in their U.S. Pat. No. 3,744,875, Haertling et al explicitly deprecate such an approach in favor of a provision of transparent electrodes coating major surfaces of the solid-state plate to be switched.

For completeness' sake, reference is also made to U.S. Pat. No. 3,868,608, which shows a surface wave filter having interdigitated comb electrodes, and to a publication Insulation/Circuits, February 1979, p. 32, which shows similar interdigitated comb structures on a test board for measurement of insulation resistance degradation. No teaching of any solution to the problems herein set forth is, however, seen from these references.

Symptomatic in this respect appears to be the recently published United Kingdom Patent Specification No. 1 534 027, by Battelle Memorial Institute, which, in the context of an electrooptical modulator device, retrogresses to the type of electrode structures shown in FIGS. 1 and 2 of the above mentioned Jones et al U.S. Pat. No. 3,124,635.

SUMMARY OF THE INVENTION

It is a general object of this invention to overcome the disadvantages and meet the needs expressed or implicit in the above disclosure statement or in any part of the subject disclosure.

It is also an object of this invention to increase feasible electrode density in electrode structures and to provide articles of manufacture having such increased electrode density.

It is also an object of this invention to provide improved electrically switchable light gate structures and apparatus.

It is a related object of this invention to provide increased electrode and gatable element densities in light gate structures.

It is a germane object of this invention to provide improved terminal structures or arrangements for connecting light gate and other electrode structures to electrical leads or driving circuitry.

It is a related object of this invention to improve performance and utility of various PLZT and other solid-state devices.

It is a germane object of this invention to reduce the requisite voltage for switching PLZT and other solid-state light gates in structures having a multitude of independently switchable light gate regions.

It is also an object of this invention to improve performance and utility of methods and apparatus for recording varying electric signals.

It is also an object of this invention to improve performance and utility of methods and apparatus for reading information perceptible upon illumination.

It is a related object of this invention to improve performance and utility of methods and apparatus for modulating light from a spatially concentrated source of divergent light.

Other objects of the invention will become apparent in the further course of this disclosure.

From one aspect thereof, the subject invention resides in a method of increasing feasible electrode density in electrode structures having spaced parallel electrodes on a substrate having spaced parallel edges. The invention according to this aspect resides, more specifically, in the improvement comprising in combination the steps of subdividing said spaced parallel electrodes into first and second electrode arrays alternating with each other along an elongate region of said substrate between said spaced parallel edges, allocating to each of said electrode arrays a plurality of said electrodes, providing on one side of said elongate region of the substrate first individual terminals for the electrodes in each first electrode array, spacing any first individual terminal of any one of the electrodes in any of said first electrode arrays from the first individual terminal of any other electrode in the particular first electrode array by a center-to-center distance greater than the center-to-center spacing between said one electrode and said other electrode, while arranging said first individual terminals side by side along one of said parallel edges to provide each first individual terminal with an individual connection lead path being free of any other terminal and intersecting a plane extending at right angles to said substrate through said one of said parallel edges for connection of a lead to the particular first terminal, providing on the other side of the elongate region of the substrate second individual terminals for the electrodes in each second electrode array, spacing any second individual terminal of any one of the electrodes in any one of said second electrode arrays from the second individual terminal of any other electrode in the particular second electrode array by a center-to-center distance greater than the center-to-center spacing between the latter one electrode and the latter other electrode, while arranging said second individual terminals side by side along the other of said parallel edges to provide each second individual terminal with an individual connecting lead path being free of any other terminal and intersecting a plane extending at right angles to said substrate through the other of said parallel edges for connection of a lead to the particular second individual terminal.

From another aspect thereof, the subject invention resides in a method of increasing feasible electrode density in electrode structures having spaced parallel interdigitated first and second electrodes on a substrate having spaced parallel edges. The invention according to this aspect resides, more specifically, in the improvement comprising in combination the steps of subdividing said spaced parallel interdigitated first and second electrodes into first and second electrode arrays alternating with each other along an elongate region of said substrate between said spaced parallel edges, allocating to each of said electrode arrays a plurality of said first electrodes and a plurality of said second electrodes, providing for each plurality of first electrodes in each first electrode array a first common electrode located at a first side of said elongate region, providing for each plurality of first electrodes in each second electrode array a second common electrode located at an opposite second side of said elongate region, providing terminal means for said first and second common electrodes, providing on said second side of said elongate region of the substrate first individual terminals for the second electrodes in each first electrode array, spacing any first individual terminal of any one of the second electrodes in any of said first electrode arrays from the first individual terminal of any other second electrode in the particular first electrode array by a center-to-center distance greater than the center-to-center spacing between said one second electrode and said other second electrode, while arranging said first individual terminals side by side along one of said parallel edges to provide each first individual terminal with an individual connecting lead path being free of any other terminal and intersecting a plane through said one of said parallel edges for connection of a lead to the particular first terminal, providing on said first side of the elongate region of the substrate second individual terminals for the second electrodes in each second electrode array, spacing any second individual terminal of any one of the second electrodes in any one of said second electrode arrays from the second individual terminal of any other second electrode in the particular second electrode array by a center-to-center distance greater than the center-to-center spacing between the latter one second electrode and the latter other second electrode, while arranging said second individual terminals side by side along the other of said parallel edges to provide each second individual terminal with an individual connection lead path being free of any other terminal and intersecting a plane through said other of said parallel edges for connection of a lead to the particular second individual terminal.

From another aspect thereof, the subject invention resides in a method of providing an electrically switchable light gate structure having spaced parallel electrodes on a substrate having spaced parallel edges and including electrooptically active solid state material. The invention according to this aspect resides, more specifically, in the improvement comprising in combination the steps of subdividing said spaced parallel electrodes into first and second electrode arrays alternating with each other along an elongate region of said substrate between said spaced parallel edges, allocating to each of said electrode arrays a plurality of electrodes and arranging electrodes in each array into electrode groups of at least two electrodes per group, providing one one side of said elongate region of the substrate first individual terminals for the electrode groups in each first electrode array, spacing any first individual terminal of any one of the electrode groups in any of said first electrode arrays from the first individual terminal of any other electrode group in the particular first electrode array by a center-to-center distance greater than the center-to-center spacing between said one electrode group and said other electrode group, while arranging said first individual terminals side by side along one of said parallel edges to provide each first individual terminal with an individual connecting lead path being free of any other terminal and intersecting a plane through said one of said parallel edges for connection of a lead to the particular first terminal, providing on the other side of the elongate region of the substrate second individual terminals for the electrode groups in each second electrode array, spacing any second individual terminal of any one of the electrode groups in any one of said second electrode arrays from the second individual terminal of any other electrode group in the particular second electrode array by a center-to-center distance greater than the center-to-center spacing between the latter one electrode group and the latter other electrode group, while arranging said second individual terminals side by side along the other of said parallel edges to provide each second individual terminal with an individual connecting lead path being free of any other terminal and intersecting a plane through the other of said parallel edges for connection of a lead to the particular second individual terminal.

From another aspect thereof, the subject invention resides in a method of providing an electrically switchable light gate structure having spaced parallel interdigitated first and second electrodes on a substrate having spaced parallel edges and including electrooptically active solid state material. The invention according to this aspect resides, more specifically, in the improvement comprising in combination the steps of subdividing said spaced parallel interdigitated first and second electrodes into first and second electrode arrays alternating with each other along an elongate region of said substrate between said spaced parallel edges, allocating to each of said electrode arrays a plurality of said first electrodes and a plurality of said second electrodes and arranging the second electrodes in each array into electrode groups of at least two electrodes per group, providing for each plurality of first electrodes in each first electrode array a first common electrode located at a first side of said elongate region, providing for each plurality of first electrodes in each second electrode array a second common electrode located at an opposite second side of said elongate region, providing terminal means for said first and second common electrodes, providing on said second side of said elongate region of the substrate first individual terminals for the electrode groups in each first electrode array, spacing any first individual terminal on any one of the electrode groups in any of said first electrode arrays from the first individual terminal of any other electrode group in the particular first electrode array by a center-to-center distance greater than the center-to-center spacing between said one electrode group and said other electrode group, while arranging said first individual terminals side by side along one of said parallel edges to provide each first individual terminal with an individual connecting lead path being free of any other terminal and intersecting a plane through said one of said parallel edges for connection of a lead to the particular first terminal, providing on said first side of the elongate region of the substrate second individual terminals for the electrode groups in each second electrode array, spacing any second individual terminal of any one of the electrode groups in any one of said second electrode arrays from the second individual terminal of any other electrode group in the particular second electrode array by a center-to-center distance greater than the center-to-center spacing between the latter one electrode group and the latter other electrode group, while arranging said second individual terminals side by side along the other of said parallel edges to provide each second individual terminal with an individual connecting lead path being free of any other terminal and intersecting a plane through said other of said parallel edges for connection of a lead to the particular second individual terminal.

From another aspect thereof, the subject invention resides in a method of increasing feasible electrode density in electrode structures having spaced parallel interdigitated first and second electrodes on a substrate. The invention according to this aspect resides, more specifically, in the improvement comprising in combination the steps of subdividing said spaced parallel interdigitated first and second electrodes into first and second electrode arrays alternating with each other along an elongate region of said substrate, allocating to each of said electrode arrays a plurality of said first electrodes and a plurality of said second electrodes, providing for each plurality of first electrodes in each first electrode array a first common electrode located at a first side of said elongate region, providing for each plurality of first electrodes in each second electrode array a second common electrode located at an opposite second side of said elongate region, providing terminal means for said first and second common electrodes, providing an individual terminal for each of said second electrodes, spacing any individual terminal of any one second electrode from any other individual terminal of any adjacent second electrode by a center-to-center distance greater than the center-to-center spacing between said one second electrode and said adjacent second electrode, aligning the individual terminals of the second electrodes in each of said first electrode arrays along a first line on said second side of the elongate region of the substrate, and aligning the individual terminals of the second electrodes in each of said second electrode a-rays along a second line or said first side of the elongate region.

From another aspect thereof, the subject invention resides in a method of increasing feasible electrode density in electrode structures having spaced parallel interdigitated first and second electrodes in a light gate structure including electrooptically active solid state material. The invention according to this aspect resides, more specifically, in the improvement comprising in combination the steps of subdividing said spaced parallel interdigitated first and second electrodes into first and second electrode arrays alternating with each other along an elongate region of said light gate structure, allocating to each of said electrode arrays a plurality of said first electrodes and a plurality of said second electrodes, providing for each plurality of first electrodes in each first electrode array a first common electrode located at a first side of said elongate region, providing for each plurality of first electrodes in each second electrode array a second common electrode located at an opposite second side of said elongate region, providing terminal means for said first and second common electrodes, providing an individual terminal for each of said second electrodes, spacing any individual terminal of any one second electrode from any other individual terminal of any adjacent second electrode by a center-to-center distance greater than the center-to-center spacing between said one second electrode and said adjacent second electrode, aligning the individual terminals of the second electrodes in each of said first electrode arrays along a first line on said second side of the elongate region of the substrate, and aligning the individual terminals of the second electrodes in each of said second electrode arrays along a second line on said first side of the elongate region.

From another aspect thereof, the subject invention resides in a method of increasing feasible electrode density in electrode structures having spaced parallel electrodes on a substrate. The invention according to this aspect resides, more specifically, in the improvement comprising in combination the steps of subdividing said spaced parallel electrodes into first and second electrode arrays alternating with each other along an elongate region of said substrate, allocating to each of said electrode arrays a plurality of said electrodes, providing individual terminals for said electrodes, spacing any individual terminal of any one of said electrodes from the individual terminal of any other electrode by a center-to-center distance greater than the center-to-center spacing between said one electrode and said other electrode, distributing the individual terminals of the electrodes in each of said first electrode arrays along a line on one side of the elongate region of the substrate, and distributing the individual terminals of the electrodes in each of said second electrode arrays along a line on the other side of the eleongate region.

From another aspect thereof, the subject invention resides in a method of increasing feasible electrode density in electrode structures having spaced parallel interdigitated first and second electrodes on a substrate. The invention according to this aspect resides, more specifically, in the improvement comprising in combination the steps of subdividing said spaced parallel interdigitated first and second electrodes into first and second electrode arrays alternating with each other along an elongate region of said substrate, allocating to each of said electrode arrays a plurality of said first electrodes and a plurality of said second electrodes, providing individual terminals for said second electrodes, spacing any individual terminal of any one of said second electrodes from the individual terminal of any other second electrode by a center-to-center distance greater than the center-to-center spacing between said one second electrode and said other second electrode, distributing the individual terminals of the second electrodes in each of said first electrode arrays along a line on one side of the elongate region of the substrate, distributing the individual terminals of the second electrodes in each of said second electrode arrays along a line on the other side of the elongate region, and providing terminal means for said first electrodes.

From another aspect thereof, the subject invention resides in a method of providing an electrically switchable light gate structure having spaced parallel electrodes on a substrate including electrooptically active solid state material. The invention according to this aspect resides, more specifically, in the improvement comprising in combination the steps of subdividing said spaced parallel electrodes into first and second electrode arrays alternating with each other along an elongate region of said substrate, allocating to each of said electrode arrays a plurality of said electrodes and arranging electrodes in each array into electrode groups of at least two electrodes per group, providing an individual terminal for each electrode group, spacing any individual terminal of any one of said electrode groups from the individual terminal of any other electrode group by a center-to-center distance greater than the center-to-center spacing between said one electrode group and said other electrode group, distributing the individual terminals of the electrode groups in each of said first electrode arrays along a line on one side of the elongate region of the substrate, and distributing the individual terminals of the electrode groups in each of said second electrode arrays along a line on the other side of the elongate region.

From another aspect thereof, the subject invention resides in a method of providing an electrically switchable light gate structure having spaced parallel interdigitated first and second electrodes on a substrate including electooptically active solid state material. The invention according to this aspect resides, more specifically, in the improvement comprising in combination the steps of subdividing said spaced parallel interdigitated first and second electrodes into first and second electrode arrays alternating with each other along an elongate region of said substrate, allocating to each of said electrode arrays a plurality of said first electrodes and a plurality of said second electrodes and arranging the second electrodes in each array into at least two distinct electrode groups per array, providing an individual terminal for each electrode group, spacing any individual terminal of any one of said electrode groups from the individual terminal of any other electrode group by a center-to-center distance greater than the center-to-center spacing between said one electrode group and said other electrode group, distributing the individual terminals of the electrode groups in each of said first electrode arrays along a line one one side of the elongate region of the substrate, dedistributing the individual terminals of the electrode groups in each of said second electrode arrays along a line on the other side of the elongate region, and providing terminal means for said first electrodes.

From another aspect thereof, the subject invention resides in a method of providing a light gate structure. The invention according to this aspect resides, more specifically, in the improvement comprising in combination the steps of providing a substrate including electrooptically active light gate material, providing on said substrate a plurality of interdigitated first and second electrodes defining light gate regions, arranging pluralities of said first electrodes into first groups, providing common terminal means for the first electrodes in each first group, arranging said second electrodes into second groups of less second electrodes per each second group than first electrodes in each first group, and providing for each second group a terminal for the second electrodes in the particular second group.

From another aspect thereof, the subject invention resides in a method of gating light. The invention according to this aspect resides, more specifically, in the improvement comprising in combination the steps of providing a substrate including electrooptically active light gate material, dividing said substrate into a plurality of light gate regions, subdividing each light gate region into from two to three subgate regions, driving all subgate regions of the same light gate region simultaneously, and driving the light gate regions differently from each other.

From another aspect thereof, the subject invention resides in an article of manufacture, comprising in combination, a substrate having spaced parallel edges, spaced parallel electrodes subdivided on said substrate into first and second electrode arrays alternating with each other along an elongate region of said substrate between said spaced parallel edges, with each of said first and second electrode arrays including a plurality of said electrodes, means for individually connecting the electrodes in each first electrode array to circuitry along individual connecting lead paths intersecting a plane through one of said parallel edges, including first individual terminals for the electrodes in each first electrode array arranged side by side on one side of said elongate region of the substrate along said one parallel edge, whereby each first individual terminal has an individual connecting lead path to said one parallel edge free of any other terminal, with any first individual terminal of any one of the electrodes in any of said first electrode arrays being spaced from the first individual terminal of any other electrode in the particular first electrode array by a center-to-center distance greater than the center-to-center spacing between said one electrode and said adjacent electrode, and means for individually connecting the electrodes in each second electrode array to circuitry along individual connecting lead paths intersecting a plane through the other of said parallel edges, including second individual terminals for the electrodes in each second electrode array arranged side by side on the other side of said elongate region of the substrate along said other parallel edge, whereby each second individual terminal has an individual connecting lead path to said other parallel edge free of any other terminal, with any second individual terminal of any one of the electrodes in any of said second electrode arrays being spaced from the individual terminal of any other electrode in the particular second electrode array by a center-to-center distance greater than the center-to-center spacing between the latter one electrode and the latter other electrode.

From another aspect thereof, the subject invention resides in an article of manufacture comprising, in combination, a substrate having spaced parallel edges, first and second electrode arrays alternating with each other along an elongate region of said substrate between said spaced parallel edges, each first electrode array having a plurality of first electrodes and a plurality of second electrodes, with said first and second electrodes of each first electrode array being parallel to, and spaced from, each other and interdigitated along part of said elongate region, a first common electrode for the first electrodes in each first electrode array, located at a first side of said elongate region, means for individually connecting the second electrodes in each first electrode array to circuitry along individual connecting lead paths intersecting a plane through one of said parallel edges, including first individual terminals for the second electrodes in each first electrode array arranged side by side on an opposite second side of said elongate region of the substrate along said one parallel edge, whereby each first individual terminal has an individual connecting lead path to said one parallel edge free of any other terminal, with any first individual terminal of any one of the second electrodes in any of said first electrode arrays being spaced from the first individual terminal of any other second electrode in the particular first electrode array by a center-to-center distance greater than the center-to-center spacing between said one second electrode and said adjacent second electrode, and each second electrode array having a plurality of first electrodes and a plurality of second electrodes, with the latter first and second electrodes of each second electrode array being parallel to, and spaced from, each other and interdigitated along part of said elongate region, a second common electrode for the first electrodes in each second electrode array, located at said second side of said elongate region, terminal means for individually connecting the second electrodes in each second electrode array to circuitry along individual connecting lead paths intersecting a plane through the other of said parallel edges, including second individual terminals for the second electrodes in each second electrode array arranged side by side one said first side of said elongate region of the substrate along said other parallel edge, whereby each second individual terminal has an individual connecting lead path to said other parallel edge free of any other terminal, with any second individual terminal of any one of the second electrodes in any of said second electrode arrays being spaced from the individual terminal of any other second electrode in the particular second electrode array by a center-to-center-distance greater than the center-to-center spacing between the latter one second electrode and the latter other second electrode.

From another aspect thereof, the subject invention resides in an article of manufacture comprising, in combination, a substrate having spaced parallel edges, spaced parallel electrodes subdivided on said substrate into first and second electrode arrays alternating with each other along an elongate region of said substrate between said spaced parallel edges, with each of said first and second electrode arrays including a plurality of said electrodes arranged in groups of at least two electrodes per group, means for individually connecting the electrode groups in each first electrode array to circuitry along individual connecting lead paths intersecting a plane through one of said parallel edges, including first individual terminals for the electrode groups in each first electrode array arranged side by side on one side of said elongate region of the substrate along said one parallel edge, whereby each first individual terminal has an individual connecting lead path to said one parallel edge free of any other terminal, with any first individual terminal of any one of the electrode groups in any of said first electrode arrays being spaced from the first individual terminal of any other electrode group in the particular first electrode array by a center-to-center distance greater than the center-to-center spacing between said one electrode group and said adjacent electrode group, and means for individually connecting the electrode groups in each second electrode array to circuitry along individual connecting lead paths intersecting a plane through the other of said parallel edges, including second individual terminals for the electrode groups in each second electrode array arranged side by side on the other side of said elongate region of the substrate along said other parallel edge, whereby each second individual terminal has an individual connecting lead path to said other parallel edge free of any other terminal, with any second individual terminal of any one of the electrode groups in any of said second electrode arrays being spaced from the individual terminal of any other electrode group in the particular second electrode array by a center-to-center distance greater than the center-to-center spacing between the latter one electrode group and the latter other electrode group.

From another aspect thereof, the subject invention resides in an article of manufacture comprising, in combination, a substrate having spaced parallel edges, first and second electrode arrays alternating with each other along an elongate region of said substrate between said spaced parallel edges, each first electrode array having a plurality of first electrodes and a plurality of second electrodes arranged in groups of at least two second electrodes per group, with said first and second electrodes of each first electrode array being parallel to, and spaced from, each other and interdigitated along part of said elongate region, a first common electrode for the first electrodes in each first electrode array, located at a first side of said elongate region, means for individually connecting the electrode groups in each first electrode array to circuitry along individual connecting lead paths intersecting a plane through one of said parallel edges, including first individual terminals for the electrode groups in each first electrode array arranged side by side on an opposite second side of said elongate region of the substrate along said one parallel edge, whereby each first individual terminal has an individual connecting lead path to said one parallel edge free of any other terminal, with any first individual terminal of any one of the electrode groups in any of said first electrode arrays being spaced from the first individual terminal of any other electrode group in the particular first electrode array by a center-to-center distance greater than the center-to-center spacing between said one electrode group and said adjacent electrode group, and each second electrode array having a plurality of first electrodes and a plurality of second electrodes and including electrooptically active solid state material, with the latter first and second electrodes of each second electrode array being parallel to, and spaced from, each other and interdigitated along part of said elongate region, a second common electrode for the first electrodes in each second electrode array, located at said second side of said elongate region, terminal means for said first and second common electrodes, means for individually connecting the electrode groups in each second electrode array to circuitry along individual connecting lead paths intersecting a plane through the other of said parallel edges, including second individual terminals for the second electrode groups in each second electrode array arranged side by side on said first side of said elongate region of the substrate along said other parallel edge, whereby each second individual terminal has an individual connecting lead path to said other parallel edge free of any other terminal, with any second individual terminal of any one of the electrode groups in any of said second electrode arrays being spaced from the individual terminal of any other electrode group in the particular second electrode array by a center-to-center distance greater than the center-to-center spacing between the latter one electrode group and the latter other electrode group.

From another aspect thereof, the subject invention resides in an article of manufacture comprising, in combination, a substrate, first and second electrode arrays alternating along an elongated region of said substrate, each first electrode array having a plurality of first electrodes and a plurality of second electrodes, said first and second electrodes of each first electrode array being parallel to, and spaced from, each other and interdigitated along part of said elongate region, a first common electrode for the first electrodes in the particular first electrode array, said first common electrode being located at a first side of said elongate region, and an individual terminal for each of said second electrodes, any individual terminal of any one second electrode being spaced from any other individual terminal of any adjacent second electrode by a center-to-center distance greater than the center-to-center spacing between said one second electrode and said adjacent second electrode, and the individual terminals of the second electrodes in each of said first electrode arrays being aligned along a first line on said second side of the elongate region of the substrate, each second electrode array having a plurality of first electrodes and a plurality of second electrodes, said first and second electrodes of each second electrode array being parallel to, and spaced from, each other and being interdigitated along part of said elongate region, a second common electrode for the first electrodes in the particular second electrode array, said second common electrode being located at a second side of said elongate region, and an individual terminal for each of said second electrodes, any individual terminal of any one second electrode being spaced from any other individual terminal of any adjacent second electrode by a center-to-center distance greater than the center-to-center spacing between said one second electrode and said adjacent second electrode, and the individual terminals of the second electrodes in each of said second electrode arrays being aligned along a second line on said first side of the elongate region.

From another aspect thereof, the subject invention resides in an article of manufacture comprising, in combination, a light gate structure including electrooptically active solid state material, first and second electrode arrays alternating along an elongate region of said light gate structure, each first electrode array having a plurality of first electrodes and a plurality of second electrodes, said first and second electrodes of each first electrode array being parallel to, and spaced from, each other and interdigitated along part of said elongate region, a first common electrode for the first electrodes in the particular first electrode array, said first common electrode being located at a first side of said elongate region and an individual terminal for each of said second electrodes, any individual terminal of any one second electrode being spaced from any other individual terminal of any adjacent second electrode by a center-to-center distance greater than the center-to-center spacing between said one second electrode and said adjacent second electrode, and the individual terminals of the second electrodes in each of said first electrode arrays being aligned along a first line on said second side of the elongate region of the substrate, each second electrode array having a plurality of first electrodes and a plurality of second electrodes, said first and second electrodes of each second electrode array being parallel to, and spaced from, each other and being interdigitated along part of said elongate region, a second common electrode for the first electrodes in the particular second electrode array, said second common electrode being located at a second side of said elongate region, and an individual terminal for each of said second electrodes, any individual terminal of any one second electrode being spaced from any other individual terminal of any adjacent second electrode by a center-to-center distance greater than the center-to-center spacing between said one second electrode and said adjacent second electrode, and the individual terminals of the second electrodes in each of said second electrode arrays being aligned along a second line on said first side of the elongate region, and terminal means for said first and second common electrodes.

From another aspect thereof, the subject invention resides in an article of manufacture comprising, in combination, a substrate, spaced parallel electrodes subdivided on said substrate into first and second electrode arrays alternating along an elongate region of said substrate, with each of said first and second electrode arrays including a plurality of said electrodes, individual terminals for the electrodes in each first electrode array distributed along a line on one side of said elongate region of the substrate, with any individual terminal of any one of the electrodes in any of said first electrode arrays being spaced from the individual terminal of any other electrode in the particular first electrode array by a center-to-center distance greater than the center-to-center spacing between said one electrode and said other electrode, and individual terminals for the electrodes in each second electrode array distributed along a line on the opposite side of said elongate region of the substrate, with any individual terminal of any one of the electrodes in any of said second electrode arrays being spaced from the individual terminal of any other electrode in the particular second electrode array by a center-to-center distance greater than the center-to-center spacing between the latter one electrode and the latter other electrode.

From another aspect thereof, the subject invention resides in article of manufacture comprising, in combination, a substrate, spaced parallel interdigitated first and second electrodes subdivided on said substrate into first and second electrode arrays alternating along an elongate region of said substrate, with each of said first and second electrode arrays including a plurality of said first and second electrodes, individual terminals for the second electrodes in each first electrode array distributed along a line on one side of said elongate region of the substate, with any individual terminal of any one of the second electrodes in any of said first electrode arrays being spaced from the individual terminal of any other second electrode in the particular first electrode array by a center-to-center distance greater than the center-to-center spacing between said one second electrode and said other second electrode, individual terminals for the second electrodes in each second electrode array distributed along a line on the opposite side of said elongate region of the substrate, with any individual terminal of any one of the second electrodes in any of said second electrode arrays being spaced from the individual terminal of any other second electrode in the particular second electrode array by a center-to-center distance greater than the center-to-center spacing between the latter one electrode and the latter other electrode, and terminal means for said first electrodes.

From another aspect thereof, the subject invention resides in an article of manufacture comprising, in combination, a substrate, spaced parallel electrodes subdivided on said substrate into first and second electrode arrays alternating along an elongate region of said substrate, with each of said first and second electrode arrays including a plurality of said electrodes arranged in electrode groups of at least two electrodes per group, individual terminals for the electrode groups in each first electrode array distributed along a line on one side of said elongate region of the substrate, with any individual terminal of any one of the electrode groups in any of said first electrode arrays being spaced from the individual terminal of any other electrode group in the particular first electrode array by a center-to-center distance greater than the center-to-center spacing between said one electrode group and said other electrode group, and individual terminals for the electrode groups in each second electrode array distributed along a line on the opposite side of said elongate region of the substrate, with any individual terminal of any one of the electrode groups in any of said second electrode arrays being spaced from the individual terminal of any other electrode group in the particular second electrode array by a center-to-center distance greater than the center-to-center spacing between the latter one electrode group and the latter other electrode group.

From another aspect thereof, the subject invention resides in an article of manufacture comprising, in combination, a substrate, spaced parallel interdigitated first and second electrodes subdivided on said substrate into first and second electrode arrays alternating along an elongate region of said substrate, with each of said first and second electrode arrays including a plurality of said first electrodes and a plurality of said second electrodes arranged in electrode groups of at least two second electrodes per group, individual terminals for the electrode groups in each first electrode array distributed along a line on one side of said elongate region of the substrate, with any individual terminal of any one of the electrode groups in any of said first electrode arrays being spaced from the individual terminal of any other electrode group in the particular first electrode array by a center-to-center distance greater than the center-to-center spacing between said one electrode group and said other electrode group, and individual terminals for the electrode groups in each second electrode array distributed along a line on the opposite side of said elongate region of the substrate, with any individual terminal of any one of the electrode groups in any of said second electrode arrays being spaced from the individual terminal of any other electrode group in the particular second electrode array by a center-to-center distance greater than the center-to-center spacing between the latter one electrode group and the latter other electrode group.

From another aspect thereof, the subject invention resides in a light gate structure and, more specifically, resides in the improvement comprising, in combination, a substrate including electrooptically active light gate material, a plurality of interdigitated first and second electrodes defining light gate regions on said substrate, pluralities of said first electrodes being present in first groups, and second electrodes being present in second groups of less second electrodes per each second group than first electrodes in each first group, common terminal means for the first electrodes in each first group, and a terminal for the second electrodes in each second group.

From another aspect thereof, the subject invention resides in light gating apparatus and, more specifically, resides in the improvement comprising, in combination, a substrate including electrooptically active light gate material, a plurality of light gate regions on said substrate each composed of at least two subgate regions, and means for driving said light gate regions, including means for driving all subgate regions of the same light gate region simultaneously and for driving the light gate regions different from each other.

BRIEF DESCRIPTION OF THE DRAWINGS

The subject invention and its various aspects and objects will become more rapidly apparent from the following detailed description of preferred embodiments thereof, illustrated by way of example in the accompanying drawings, in which like reference numerals designate like or functionally equivalent parts, and in which:

FIG. 4 is an elevation of an interdigitated electrode array structure according to a further preferred embodiment of the subject invention;

FIG. 5 is an elevation of an interdigitated electrode array structure according to a further preferred embodiment of the subject invention;

DESCRIPTION OF PREFERRED EMBODIMENTS

Figure 1:
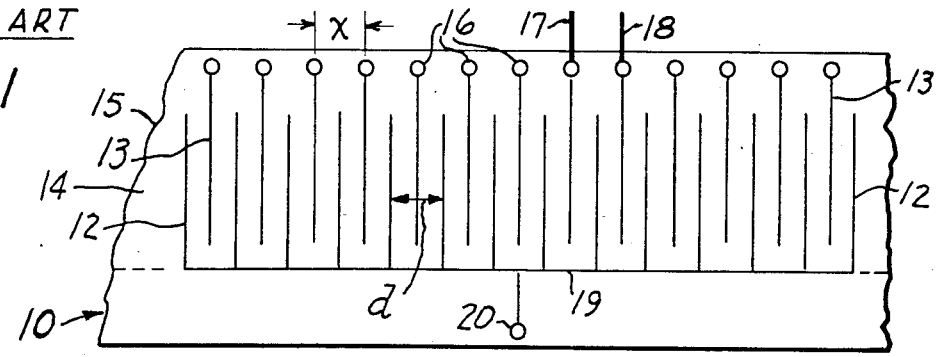
FIG. 1 is an elevation of a prior-art interdigitated electrode array structure.

The prior-art electrode array structure 10 shown in FIG. 1 has spaced parallel interdigitated first and second electrodes 12 and 13 alternating along an elongate region 14 of a substrate 15. Depending on the use of the electrode array structure, the substrate 15 may be merely a support for the electrodes or may be chip or other structure on which a voltage or electric current supplied to the electrodes act. If desired, the substrate 15 may be supportive of a material on which a voltage or electric current supplied to the electrodes acts. For instance, the substrate may include or be supportive of a photoconductor material if the electrode array structure is to act as or in an optical scanner or some such apparatus. The substrate 15 may include or be supportive of a low Curie point material if the electrode array is to have a thermomagnetic or thermoremanent function. In the case of light arrays, the substrate 15 may consist or be supportive of an electrooptically active material, such as a PLTZ or other solid state compound capable of acting or functioning in response to applied electric potentials or energy. Other compositions of the substrate and other uses of the electrode array structures herein shown or disclosed are apparent within the confines of the state of the art in various fields of endeavor.

The formation or deposition of electrode structures on various substrates is a well-established art. Suffice it to say, therefore, that the electrode structure may be deposited on the substrate 15 by such techniques as vacuum deposition, techniques involving chemical etching or photoetching, evaporation, plating, painting or sputtering, and that preferred electrode materials include, for example, gold, indium, chromium and aluminum, depending on the use of the electrode structure.

The width or thickness of the individual electrode wires or strips also depends on the intended utility. For electrooptical applications an electrode thickness or width of 10 to 50 $\mu$m is typical. The spacing d between adjacent electrodes generally determines the resolution of the electrode array or the resolution attainable therewith. For instance, in an electrooptical device, the spacing between adjacent electrodes determines the number of light gates that can be provided per unit of linear measure, such as inch or centimeter. In this respect, the size of the electrode terminals 16 cannot arbitrarily be reduced even where a reduction of electrode thickness or width is possible. In electrooptical and other applications, where at least one of the electrodes in each pair such as each electrode 13, has to be individually driven or energized from its own distinct lead 17, 18 et seq. which has to be soldered, welded or otherwise fastened to the particular individual terminal 16, with a tool that is necessarily wider than the connecting wire, the requisite terminal size and attainable minimum terminal spacing, rather than the attainable minimum electrode thickness or width are in fact determinant of the electrode spacing and thus of attainable electrode density and resulting resolution.

In many applications, a common electrode or lead 18 may be provided for jointly energizing one type of electrodes, such as the electrodes 12 as shown in FIG. 1. Such common electrode 19 may have its own terminal 20 which then serves as a common terminal for the electrodes 12.

In practice, and as may be seen from FIG. 1, even use of a common terminal 20 for one-half of the electrodes does not as such prevent the minimum attainable spacing d between adjacent second electrodes 13 from being in effect dictated by the minimal permissible spacing between the typically larger individual electrode terminals 16 having a center-to-center distance x.

Assuming for the purpose of comparison the minimum permissible spacing between adjacent terminals 16 to be as shown in FIG. 1, it is apparent that only thirteen gate electrodes 13 can be accommodated within the given length of electrode array shown in FIG. 1. This means that only twenty-six interelectrode spaces or light gate elements 22 can be provided within the illustrated length. In practice, this may further reduce itself to thirteen actual light gates, since each individual electrode 13 controls or gates the two spaces between itself and the adjacent common electrodes 12.

By way of further background, reference may also be had to the further electrode structure disclosed in references listed in the above disclosure statement.

Figure 2:
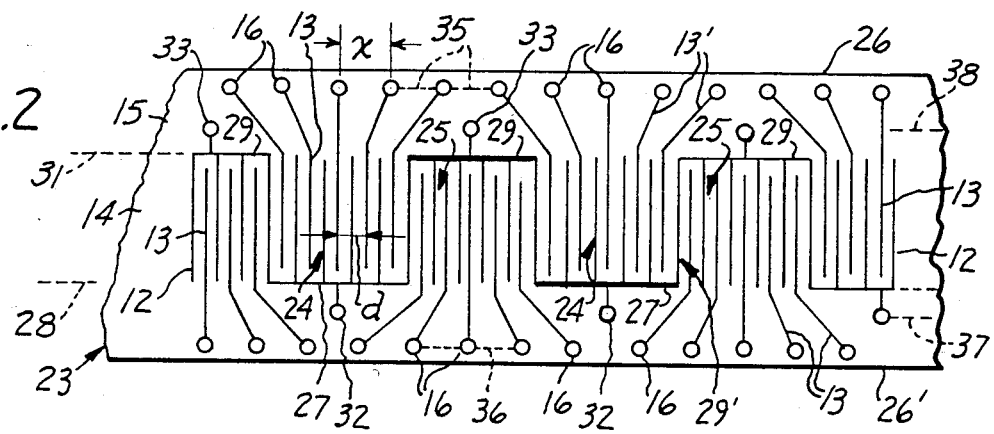
FIG. 2 is an elevation of a prior-art interdigitated electrode array structure in accordance with a preferred embodiment of the subject invention.

FIG. 2 shows how obstacles of structures and systems mentioned in the disclosure statement have been removed in accordance with a preferred embodiment of the subject invention.

In particular, the spaced parallel interdigitated first and second electrodes 12 and 13 in the electrode array structure 23 shown in FIG. 2 are subdivided into first and second electrode arrays 24 and 25 alternating with each other along an elongate region 14 of the substrate 15. To render the electrode structure 23 practically effective, a plurality of first electrodes 12 and a plurality of second electrodes 13 are allocated to each of the two types of electrode arrays 24 and 25.

The substrate 15 has spaced parallel edges 26 and 26' and the electrode arrays 24 and 25 alternate with each other along the elongate region 14 of the substrate 15 between the spaced parallel edges 26 and 26'.

Each plurality of first electrodes 12 in each first electrode array 24 is provided with a first common electrode 27 located at a first side 28 of the elongate substrate region 14. Conversely, each plurality of first electrodes 12 in each second electrode array 25 is provided with a second common electrode 29 located at an opposite second side 31 of the elongate region 14. Terminals 32 and 33 are provided for the first and second common electrodes 27 and 29. As before, an individual terminal 16 is provided for each of the second electrodes 13. According to the illustrated preferred embodiments, any individual terminal 16 of any one second electrode 13 is spaced from any other individual terminal of any adjacent second electrode 13 by a center-to-center distance x greater than the center-to-center spacing d between that one second electrode 13 and the particular adjacent second electrode 13.

It will thus be seen that, in structural terms, each first electrode array 24 has a plurality of first electrodes 12 and a plurality of second electrodes 13, with the first and second electrodes 12 and 13 of each first electrode array 24 being parallel to and spaced from each other, and interdigitated along part of the elongate region 14. Each first electrode array 24 further has a first common electrode 27 for the first electrode 12 in the particular first electrode array 24, with such first common electrode 27 being located at a first side 28 of the elongate region 14.

Each second electrode 13 in each first electrode array 24 further has an individual terminal 16, with any individual terminal 16 of any one second electrode 13 being spaced from any other individual terminal 16 of any adjacent second electrode 13 by a center-to-center distance greater than the center-to-center spacing between the one second electrode 13 and the particular adjacent second electrode 13.

Similarly, each second electrode array 25, in structural terms, has a plurality of first electrodes 12 and a plurality of second electrodes 13, with the first and second electrodes of each second electrode array being parallel to and spaced from each other and being interdigitated along part of the elongate region 14.

Each second electrode array 25 further includes a second common electrode 29 for the first electrodes 12 in the particular second electrode array 25. That second common electrode in each second array 25 is located at a second side 31 of the elongate region 14. There again is an individual terminal 16 for each second electrode 13 in each second array 25. In accordance with the illustrated preferred embodiments, any individual terminal 16 of any one second electrode is spaced from any other individual terminal of any adjacent second electrode by a center-to-center distance x greater than one second electrode and the particular adjacent second electrode.

The first and second common electrodes 27 and 29 have terminals 32 and 33.

In the illustrated preferred electrode array embodiments, the individual terminals 16 of the second electrodes 13 in each of the first electrode arrays 24 are arranged or located at the above mentioned second side 31 of the elongate region 14 of the substrate 15. Conversely, the individual terminals 16 of the second electrodes 13 in each of the second electrode arrays 25 are arranged or located at the first side 28 of the elongate region 14.

In practice, this enables a convenient and advantageous attachment of driver or lead wires to the second electrodes 13 at both sides of the substrate 15.

Figure 3:
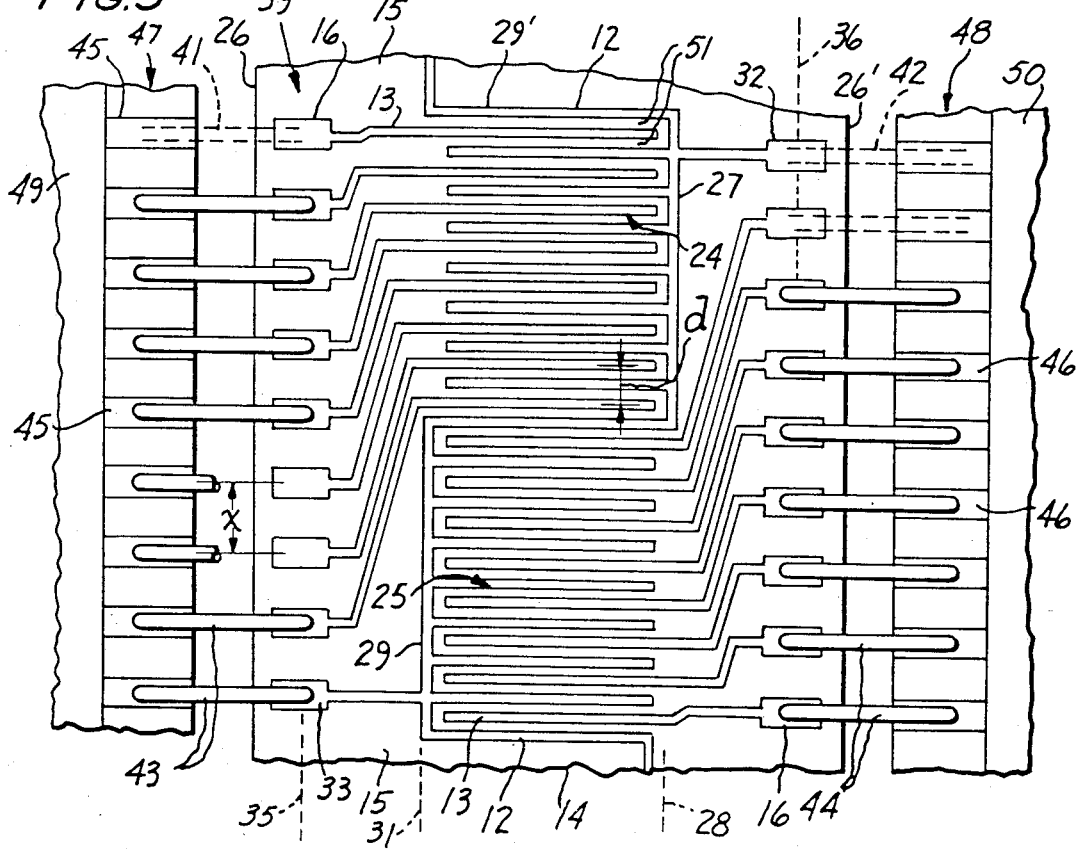
FIG. 3 is an elevation of an interdigitated electrode array structure in accordance with a further preferred embodiment of the subject invention, with fractional showings of electrode driver circuit components.

In the preferred embodiments shown in FIGS. 2 and 3, this also enables the individual terminals 16 to be spread out for increased spacing therebetween and/or increased density of the electrodes 12 and 13. As shown in FIGS. 2 and 3, slanted leads or electrode portions 34 may be employed to provide appropriate connections between the second electrodes and their individual terminals 16.

According to FIGS. 2 and 3, the individual terminals 16 of the second electrodes 13 in each of the first electrode arrays 24 are aligned along the second side 31 of the elongate substrate region 14. Conversely, the individual terminals 16 of the second electrodes 13 in each of the second electrode arrays 25 are aligned along the first side 28 of the elongate region 14.

At least in terms of efficiency and ease of connection, such an arrangement is presently preferred.

Further in accordance with a preferred embodiment of FIG. 2, not only the individual terminals 16 of the second electrode 13 in each of the second electrode arrays 25, but also the terminals 32 for the first common electrodes 27 are located at the first side 28 of the elongate region 14. In fact, in accordance with a further preferred embodiment, the individual terminals 16 of the second electrodes 13 in each of the first electrode arrays 24 and the second terminals 33 for the second common electrode 29 are arranged at the second side 31 of the elongate region 14.

Further in accordance with a preferred embodiment shown in FIG. 2, the individual terminals 16 of the second electrodes 13 in each of the first electrode arrays 24 are aligned along a first line 35 on the second side 31 of the elongate substrate region 14. Conversely, the individual terminals 16 of the second electrodes 13 in each of the second electrode arrays 25 are aligned along a second line 36 on the first side 28 of the elongate region 14.

Terminal means 32 for first common electrodes 27 are aligned along a third line 37 different from the first and second lines 35 and 36 and located on the first side 28 of the elongate region 14.

Further in accordance with a preferred embodiment, second terminals 33 for the second common electrodes 29 are aligned along a fourth line 38 different from the first, second and third lines 35, 36 and 37 and located on the second side 31 of the elongate region 14.

In practice, this permits maximum spacing between adjacent terminal pairs 16, 16; 16, 32; and 16, 33. For a given minimum spacing between such electrode pairs, a maximum spacing between such electrode pairs, a maximum interdigitated electrode density is possible.

FIG. 3, on a somewhat enlarged scale, shows an electrode structure 39 which in many respects is similar to the electrode structure shown in FIG. 2.

In addition, FIG. 3 shows an implementation of a further preferred embodiment, according to which the individual terminals 16 of the second electrodes 13 in the second electrode arrays 25 and terminals means 32 for the first common electrodes 27 are aligned along the above mentioned second line 36 on the first side 28 of the elongate region 14. Similarly, the individual terminals 16 of the second electrodes 13 in each of the first electrode arrays 24 and the second terminal means 33 for second common electrodes 29 are aligned along the above mentioned first line 35 on the second side 31 of the elongate region of the substrate. In terms of efficiency and ease of interconnection, this mutual alignment of individual and common electrodes 16/32 on the one side and 16/33 on the other side is presently most preferred. Also, the terminals 16, 32 and 33 in FIG. 3 are in the form of rectangular tabs or deposits, lending themselves to a rugged and reliable interconnection with the drive or energizing leads.

Considering now in its broad aspect the preferred embodiments of the subject invention illustrated in FIGS. 2 and 3, it will be noted that the illustrated embodiments arrange first individual terminals 16, pertaining to the first electrode arrays 24, side by side along one of the parallel edges 26 of the substrate to provide each such first individual terminal with an individual connecting lead path 41 being free of any other terminal 16, 32 or 33 and intersecting a plane extending at right angles to the substrate 15 through one of the parallel edges 26 for connection of a lead to the particular first terminal.

Similarly, the illustrated preferred embodiments arrange second individual terminals 16, pertaining to the second electrode arrays 25, side by side along the other edge 26' of the parallel substrate edges to provide each second individual terminal 16 with an individual connecting lead path 42 being free of any other terminal 16, 32 or 33 and intersecting a plane extending at right angles to the substrate 15 through that other parallel edge 26' for connection of a lead to the particular second individual terminal.

As seen in FIGS. 2 and 3, the expression "side by side along one of the parallel edges 26" and language of like import herein employed does not mean that the terminals 16 necessarily extend to the substrate edges 26 and 26' themselves. Rather, the important fact according to the illustrated aspect of the subject invention is that driver electronics or other apparatus can be connected to the terminals 16, 32 and 33 by leads, none of which has to cross over any other lead or any terminal other than the specific terminal to which the particular lead is connected.

This important feature will now be more fully illustrated with the aid of FIG. 3.

By way of background, reference may at this point be had to the above mentioned U.S. Pat. No. 3,452,342, by Raffel, who according to his FIG. 5 proposes clustering or nesting of terminals belonging to a given electrode array and alternatingly provides terminals on opposite sides of the electrode arrays.

As has been shown above in the Disclosure Statement, such an electrode clustering or multi-tier electrode arrangement has the severe disadvantage of necessitating a multitude of detrimental crossovers between terminals and connecting wires.

The currently discussed aspect of the subject invention overcomes these drawbacks and avoids the danger of faulty electrical contacts, leakage or crosstalk between connecting leads and terminals, while still achieving the desired center-to-center distances between adjacent terminals exceeding the center-to-center spacing between corresponding electrodes connected to such terminals.

In particular, and as best seen in FIG. 3, the currently discussed aspect of the subject invention provides each individual terminal 16, and for that matter also each common terminal 32 and 33, with a connecting lead path 41 or 42 that is free of any other terminal 16, 32 and 33, and that intersects a plane extending at right angles to the substrate 15 through one of the parallel edges 26 or 26' of the substrate 15.

In other words, the currently discussed aspect of the subject invention provides at least each individual terminal 16 with a path 41 or 42 along which a connecting lead 43 or 44 can extend without having to cross over any other connecting lead or any terminal to which another lead is connected, and at the same time provides for at least each individual terminal 16 the above-mentioned greater center-to-center spacing, contrary to the type of prior-art solution illustrated in FIG. 1.

As may be seen from FIG. 3, this aspect of the subject invention (a) provides each terminal 16, etc., with sufficient lateral space for the use of a wire feeding and bonding tool for attaching a connecting lead 43 or 44 to each terminal, and (b) permits the connecting leads 43 and 44 to run parallel to each other to corresponding terminals 45 and 46, respectively, of circuit boards 47 and 48 on which integrated circuits or other circuitry 49 and 50 energizing or driving the electrodes 12 and 13 and light gates 51 are located.

As already indicated above, this permits the electode arrays 24 and 25 to be provided by very high-resolution thin-film techniques and to be, nevertheless, interfaced with conventional thick-film circuit boards 47 and 48.

In accordance with a further preferred embodiment, the first and second common electrodes 27 and 29 and adjacent first electrodes 12 include one common serpentine or squarewave common electrode 29'. The provision of such serpentine electrode may have the advantage of preventing a buildup of undesired electric potentials between the electrode arrays 24 and 25 or common electrodes 27 and 29, and of obviating some of the common terminals 32 and 33. Depending on conductivity or current carrying capacity requirements, the common electrodes 27 and 29 may be made wider or otherwise provided with a larger effective cross-section, such as shown in two instances in FIG. 2.

The electrode array structures herein shown may be employed in electrooptical apparatus, although their utility obviously is not so limited.

According to a further preferred embodiment of the subject invention, eight electrodes 13 are allocated to each electrode array 24 and 25. Similarly, eight first individual terminals 16 are provided for the eight electrodes 13 in each first electrode array 24, and eight second individual terminals 16 are provided for the eight electrodes 13 in each second electrode array 25. In practice, this has the substantial advantage of enabling the electrode arrays and light gates 51 to be conveniently and effectively driven by integrated circuitry 49 and 50 conforming to a binary system; namely, the widely used $2^3$ system.

The preferred embodiment of the subject invention shown in FIG. 4 had its inception in an approach which, as mentioned in the Disclosure Statement has been deprecated by the prior art.

In particular, the light gate structure 52 shown in FIG. 4 is provided with a substrate 53 including PLZT or other electrooptically active light gate material. The substrate 53 has or is divided into a plurality of light gate regions 54. Each region 54, in turn, is composed of, or subdivided into, subgate regions 55 and 56. There preferably are from four to six subgate regions per light gate region. Four subgate regions 55 and 56 are shown in FIG. 4 for each light gate region.

All subgate regions 55 and 56 of the same light gate region 54 are energized or driven simultaneously.

To this end, means for driving all subgate regions 55 and 56 of the same light gate region 54 simultaneously may include for each light gate region 54 at least two individual electrodes 13' and a terminal 16'.

Each terminal 16' is individual as to its corresponding light gate region 54, but common as to the individual electrodes 13' and subgate regions 55 and 56 of the particular light gate region 54.

Also according to the currently discussed embodiment of the subject invention, the light gate regions 54 are energized or driven independently of each other. To this end, circuit boards and integrated or other driver circuitry of the type illustrated in FIG. 3 at 47 to 50 with circuit board terminals 45 and 46 may be employed for driving the light gate structure 52 of FIG. 4. The subdivision of light gate regions according to the preferred embodiment of the subject invention illustrated in FIG. 4, substantially reduces driving voltage requirements, as compared to light gate structures lacking subdivision of light gate regions. For instance, with a division of each light gate region into four to six subgate regions, rapid and reliable switching of the light gate regions at about three-quarters to one-half of the voltage otherwise required may be achieved. This not only reduces voltage requirements as far as driver circuitry is concerned, but also reduces electric field strength requirements as to the light gate structure itself. More specifically, dividing light gate regions into subgates reduces the scale of the electrode structure in relation to the electrooptical substrate thickness, making for more efficient use of the electric field in the electrooptically active material between and below the electrode elements.

As in the case of FIGS. 2 and 3, the embodiment of FIG. 4 may have the spaced parallel electrodes 13' and, if desired, interdigitated first electrodes 12, subdivided into first and second electrodes arrays 24 and 25 alternating with each other along an elongate region 14 of the substrate 53.

Each electrode array 24 and 25 in FIG. 4 has allocated thereto or includes a plurality of electrodes 13', or a plurality of first electrodes 12 and a plurality of second electrodes 13'. As already mentioned, the electrodes 13' are arranged in electrode groups of at least two electrodes 13' per group.

Individual terminals 16' for the electrode groups in each first electrode array 24 are distributed side by side along an edge 26 of the substrate 53. Similarly, individual terminals 16' for the electrode groups in each second electrode array 25 are distributed side by side along an opposite parallel edge 26' of the substrate 53. As before, the terminals 16' need not extend to the edges 26 and 26'. In fact, depending on the manner of mounting of the light gate structure 52, it may be more advantageous to have the terminals 16' and also the common terminals 32 and 33 stop short of the substrate edges 26 and 26'.

In accordance with the illustrated preferred embodiment shown in FIG. 4, the individual terminals 16' for the electrode groups in each first electrode array 24 may extend along a line 35 on one side of the elongate region 14 of the substrate 53.

Similarly, the individual electrodes 16' for the electrode groups in each second electrode array 25 may be distributed along a line 36 on the opposite side of the elongate region 14 of the substrate 53. As seen in FIG. 4, the common terminal 32 for the first electrodes in the first electrode array 24 may also be located on the line 36. Similarly, the common terminal 33 of the first electrodes 12 in the second electrode array 25 may be located on the line 35.

In FIG. 4, the common terminals 32 and 33 are designated by the numeral 0, since these common terminals are typically grounded in practice. On the other hand, the terminals 16' are respectively designated in FIG. 4 by numerals 1 to 8 to indicate the eight different driver circuits to which each electrode array is connected according to the best mode presently contemplated for carrying the subject invention into effect. Moreover, as is easily apparent from FIG. 4, any individual terminal 16' of any one of the electrode groups in any of the electrode arrays is spaced from the individual terminal 16' of any other electrode group in the particular electrode array by a center-to-center distance greater than the center-to-center spacing between that one electrode group and that other electrode group.

In other words, the increased center-to-center distance feature of the embodiments of FIGS. 2 and 3 has also been implemented in the embodiment of FIG. 4 of the subject invention.

In principle, the features of FIG. 4 may be applied to electrode structures other than light gate structures.

FIG. 4. also manifests a broader principle of the subject invention, in that it comprises a plurality of interdigitated first and second electrodes 12 and 13' defining light gate regions 54 on the substrate 53. Pluralities of the first electrode 12 are present in first groups which contain as many first electrodes 12 as are connected to a common electrode 27 or to a common electrode 29. The second electrodes 13' are present in second groups of less second electrodes 13' in each second group than first electrodes 12 in each first group. Common terminal means 32 or 33 are provided for the first electrodes 12 in each first group. On the other hand, a terminal 16' is provided for the second electrodes 13' in each second group.

Preferably, the number of first electrodes 12 in any first group (e.g. in any array 24 or 25) is more than twice the number of second electrodes 13' in any second group.

According to the preferred embodiment illustrated in FIG. 4, the number of first electrodes 12 in each first group is a multiple of the number of second electrodes 13' in each second group. For instance, each group 24 or 26 may ave thirty-two first electrodes 12 connected to a common terminal 32 or 33, and each second group may then have two electrodes 13' connected to a corresponding terminal 16'. The first and second electrodes 12 and 13' preferably are uniformly spaced from each other along the light gate structure 52 so as to provide uniform light gate regions 54, and subgates 55 and 56 of uniform width. In this manner, the second electrodes 13' of a second group, together with first electrodes 12 interdigitated therewith, define on the substrate 53 a light gate region 54 which, in turn, is composed of subgates 55 and 56.

As in the case of FIGS. 2 and 3, a serpentine common electrode 29' extending through the first groups or arrays 24 and 25 along part of the first electrodes 12, and being connected to the common terminals 32 and 33, may be present.

Figure 6:
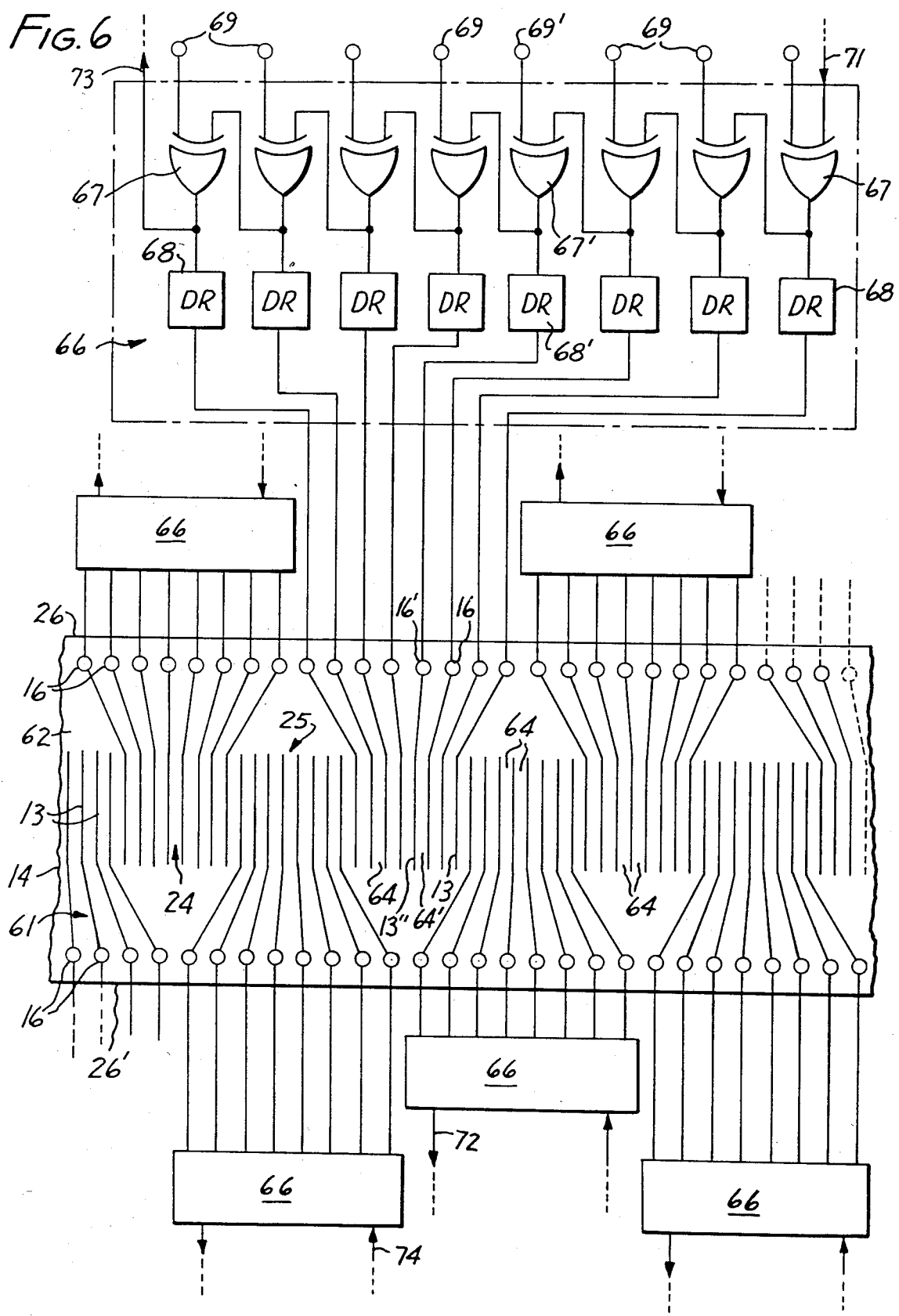
FIG. 6 is an elevation of an interdigitated electrode array structure of the type shown in FIG. 5, and a diagram of electrode driver circuitry.

The electrode structure 61 shown in FIGS. 5 and 6 is of a single aperture or floating electrode type, which has only one type of electrodes such as the above mentioned electrodes 13, located on a substrate 62. As before, the spaced parallel electrodes are subdivided into first and second electrode arrays 24 and 25 alternating with each other along an elongate region 14 of the substrate 62.

What has been said so far with respect to the embodiments of FIGS. 2 to 4 may also be applied to the embodiment of FIGS. 5 to 6, with the principal exception, however, that no first electrodes 12, no common electrodes 27, 29 and 29' and no common terminals 32 and 33 are present in the embodiment of FIGS. 5 and 6. Rather, if the structure 61 is a light gate structure, then each individual light gate region 64 is driven and laterally delimited by two adjacent electrodes 13.

As before, the individual terminals of the electrodes 13 are arranged side by side along the parallel edges 26 or 26' of the substate 62 to provide each individual terminal 16 with the above mentioned individual connecting lead path (see 41 or 42 in FIG. 3) being free of any other terminal and intersecting a plane extending at right angles to the substrate through one of the parallel edges 26 or 26' for connection of a lead (see 43 and 44 in FIG. 3) to the particular first terminal 16.

Other statements applicable to the embodiment of FIGS. 5 and 6 and concerning advantageous arrangements of the individual terminals 16 may readily be derived from the above description of FIGS. 2 and 3, paying particular attention to sides 28 and 31 and lines 35 and 36.

The electrode structure shown in FIGS. 5 and 6 has the advantage, relative to the embodiments so far specifically described, of permitting a doubling of the density of individually switchable gates. However, as already pointed out by Cutchen et al on page 10 of their above mentioned article published in 1973 Wescon Technical Papers, such single-aperture gate configurations typically require external coding to produce the desired light gate excitation patterns. In particular, Cutchen et al proposed a combination of an Exlusive OR logic gate with a shift register.

A particularly advantageous light gate driving apparatus 66 is shown in FIG. 6. The apparatus 66 has as many Exclusive OR elements 67 as there are terminals 16 or electrodes 13 in the particular array. Each Exclusive OR element has an output connected via a driver 68 to a corresponding terminal 16 and electrode 13.

Initially, the Exclusive OR element 67 with drivers 68 maintain the electrodes 13 of the particular array at the same polarity, so that none of the light gates 64 is turned on or energized.

Each Exclusive OR element 67 has a first input connected to the output of the next-preceding Exclusive OR element, and a second input connected to a gating input terminal 69 of the driver apparatus. In the absence of any gating input signal, each Exclusive OR element 67 thus applies a low potential (A) to the first input of the next-succeeding Exclusive OR element. This, in effect, maintains all electrodes 13 at the same potential.

If it is now desired to turn on or energize one of the gates 64, then the operator or a control circuit applies a gating signal to one of the inputs 69, designated by way of example by a prime mark as 69' in FIG. 6. Such applied high-level gating signal (B) at the second input of the particular Exclusive OR element, designated as 67' for easier identification, eventuates in an output signal which that OR element 67' applies to the first input of the next-succeeding Or element 67, as well as to the input of a corresponding driver, designated by the reference numeral 68'.

As a result, the driver 68' changes the polarity of the corresponding terminal 16' and thus of the corresponding electrode 13'' in FIG. 6. This creates a potential difference or electric field relative to the next-preceding electrodes 13, across a gate region 64'. The gate at 64' is, therefore, turned on in response to the gating signal received at 69'.

Of course, if the polarity of the electrode 13'' is changed relative to the next-preceding electrode 13, then it is in principle also changed relative to the next succeeding electrode 13. In that case, two adjacent gate regions, having the electrode 13'' in the middle, would be turned on. This, by way of example, corresponds to the above mentioned aspect of the subject invention wherein each light gate region is subdivided into at least four simultaneously driven subgate regions. In this manner, the electrode density per gate could effectively be doubled, while the driving voltage and field strength requirements are halved.

The latter mode of operation of the single-aperture gate structure of FIGS. 5 and 6 is within the broad contemplation of the subject invention. However, FIG. 6 shows a driving apparatus 66, in which any one gating signal will turn on only one light gate region 64 between two adjacent electrodes 13. To this end, the energized Exclusive OR element 67' presently under discussion applies its output signal not only to the driver 68' for a change in polarity of the electrode 13'', but also to the above mentioned first input of the next-succeeding Exclusive OR element 69.

The resulting high-level signal (A) at the first input of the next-succeeding Exclusive OR element 67, in conjunction with the then prevailing low-level signal (B̄) at its second input, causes the next-succeeding Exclusive OR element to apply to its corresponding driver 68 an output signal which changes the polarity of the next-succeeding electrode 13.

By operation of the illustrated connection between the output of each Exclusive OR element and the first input of the next-succeeding Exclusive OR element, the polarity of all electrodes 13 succeeding the switch electrode 13'' is also switched, so that none of the gates other than the gate 64' is turned on by the gating signal applied to the input 69' of the driver apparatus 66.

Each of the electrode arrays 24 and 25 has its own driver apparatus 66 which may be identical in composition to the driver apparatus illustrated at the top of FIG. 6 and described above. For a proper operation of the light gate structure 61, the first Exclusive OR element 67 of the driver apparatus 66 shown at the top of FIG. 6 has its first input 71 connected to the output 72 of the next-preceding driver apparatus 66 shown below the light gate structure 61 in FIG. 6. Similarly, the eighth Exclusive OR element 67 of the driver apparatus 66 shown at the top of FIG. 6 has its output via a lead 73 connected to the first input 74 of the next-succeeding driver apparatus 66 shown at the bottom of FIG. 6. The remaining driver apparatus 66 are respectively interconnected in a corresponding manner, as partially indicated by dotted leads and arrows in FIG. 6.

Figure 7:
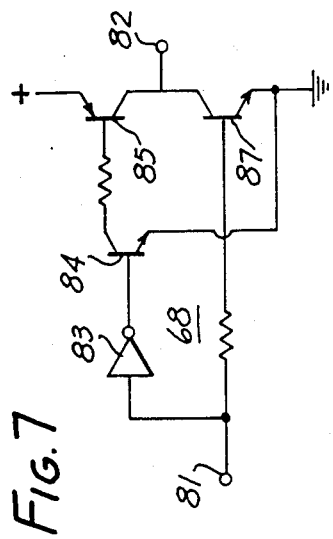
FIG. 7 is a diagram of a driver component which may be employed in the circuitry of FIG. 6.

By way of example, FIG. 7 presents a schematic of a driver 68 which may be employed in the apparatus 66 of FIG. 6.

In particular, the driver 68 according to FIG. 7 has an input terminal 81 connected to the output of the corresponding Exclusive OR element 67 in the particular driver apparatus 66. The driver 68 also has an output terminal 82 connected to the corresponding individual terminal 16 of an electrode 13. If the input signal at the terminal 81 is low, then an inverter 83 applies a high output to the base of a transistor 84. This NPN transistor, in turn, then supplies base current to a transistor 85. This, in effect, connects the output terminal 82 to the positive input of the transistor 85. The corresponding electrode 13 in the light gate structure 61 is, therefore, biased positively in the quiescent state of the light gate arrays.

On the other hand, an output signal of the corresponding Exclusive OR element 67 applies a high-level signal to the driver input 81. This operates through the inverter 83 to turn off the transistors 84 and 85, whereby the positive potential is at the moment removed from the output terminal 82 and thus from the corresponding electrode 13. On the other hand, the high-level signal at input 81 acts on the base of an NPN transistor 87 which, in turn, pulls the output terminal 82 and thus the corresponding electrode 13 to ground. The polarity of the particular electrode 13 is thus changed relative to the next-preceeding electrode 13. Of course, the expression "polarity change" and expression of similar import as herein employed are intended to be broad enough to cover also a selective grounding of electrodes relative to a potential, or a selective application of a potential to an electrode relative to an adjacent grounded electrode, as well as a switching of the polarity of an applied voltage at any electrode.

Figure 8:
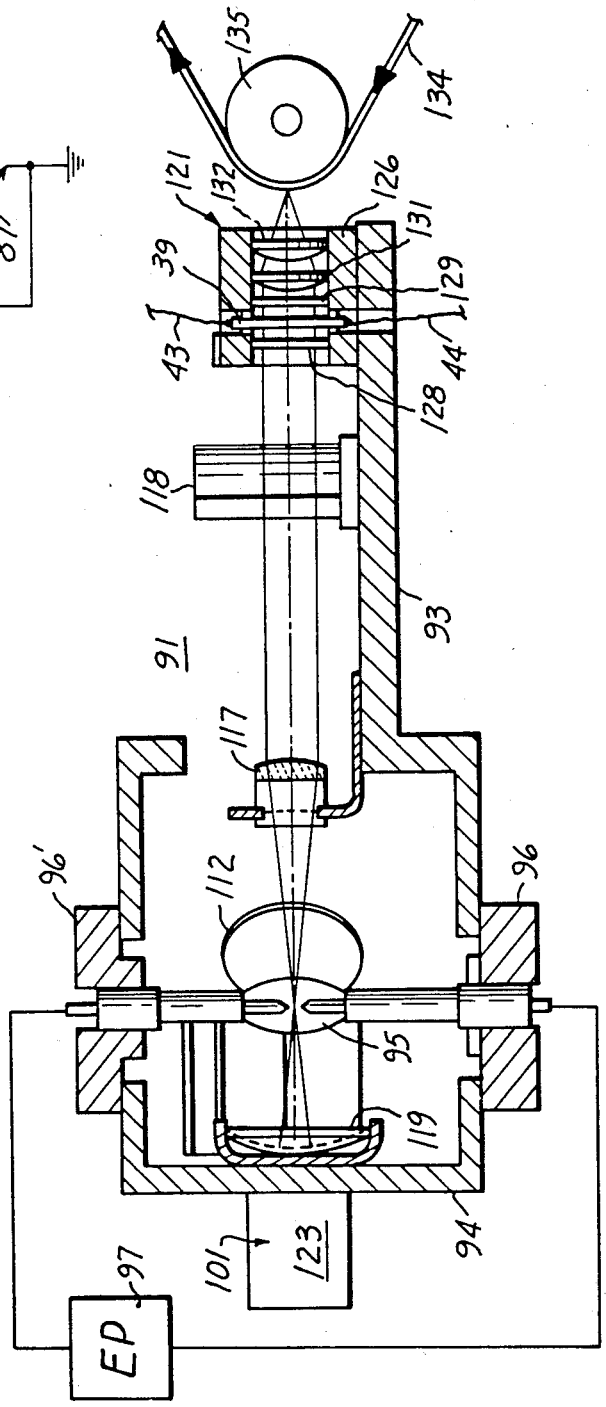
FIG. 8 is a section, taken along the line 8—8 in FIG. 9, of a solid-state facsimile or oscillograph apparatus employing any of the electrode array structures according to the subject invention or embodiments thereof.
Figure 9:
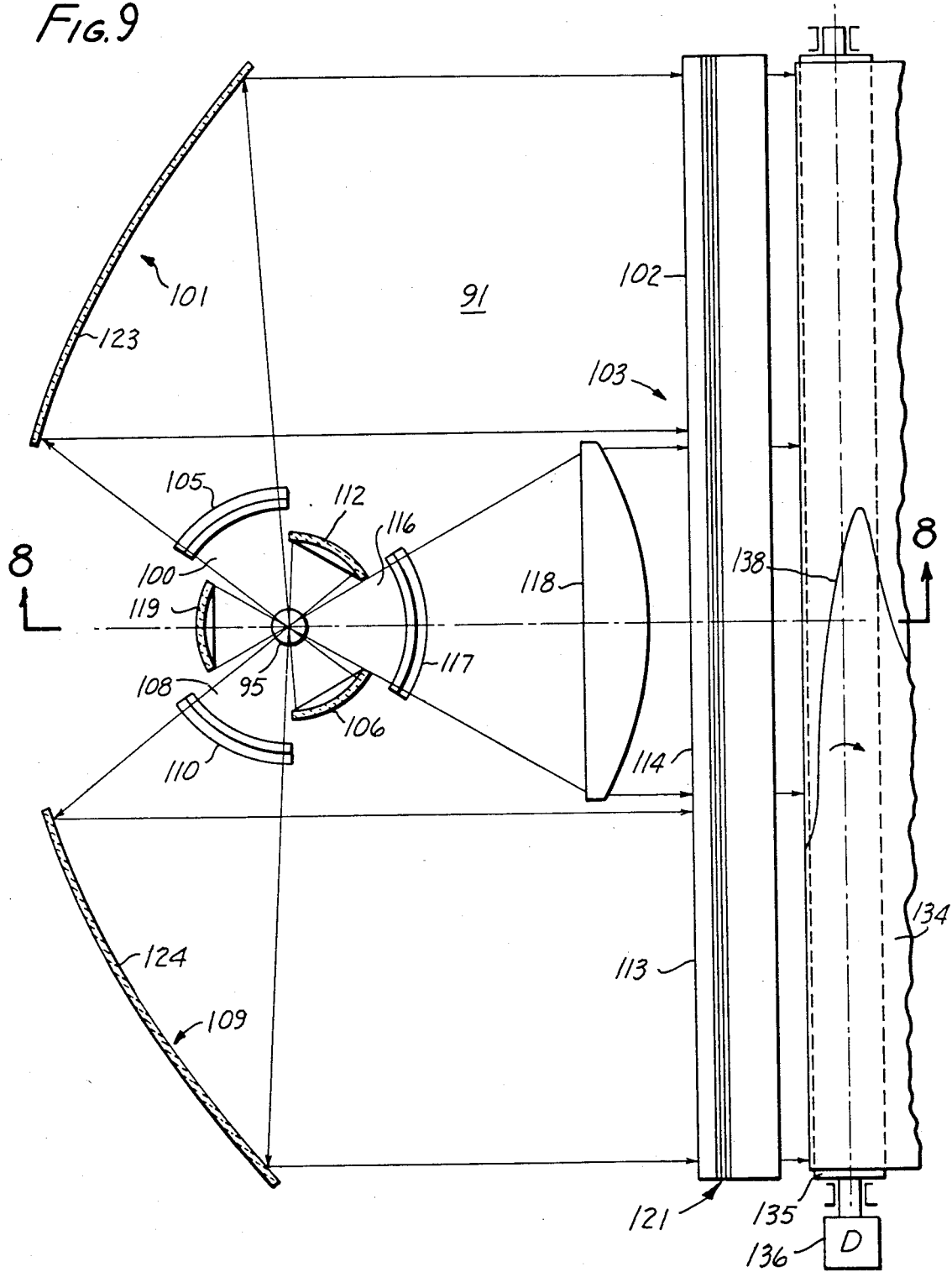
FIG. 9 is a top view of the apparatus of FIG. 8.

FIGS. 8 and 9, by way of example, show solid-state oscillograph and facsimile apparatus 91 employing the electrode or light gate structure shown in any of the preceding FIGS. 2 to 6.

In particular, the solid-state oscillograph or facsimile apparatus 91 shown in FIGS. 8 and 9 has a base 93 and a lamp housing 94. A source of spatially concentrated light, such as a shot arc gas discharge lamp 95, is mounted in the lamp housing 94 by means of sockets 96 and 96', and is electrically energized from an electric power source 97. The showing of the base 93, lamp housing 94, socket mounts 95 and 96 and power source 97 has been omitted from FIG. 9 for increased clarity. As best seen in FIG. 9, a first part 100 of the light output of the source 95 is emitted to a first region 101 and is reflected at that first region to a first portion 102 of an elongate second region 103. The means for emitting the first light part 100 include a cylindrical belt lens 105 and a lamp reflector 106. Cylindrical belt lenses as such are known in the oscillography art and in effect consist of an elongate lens which is cylindrical in a direction transverse to its direction of elongation and which is curved in its direction of elongation.

The lamp mirror 106 reflects light emitted by the lamp 95 and adds such reflected light to the first light part 100 emitted to the first region 101. Similarly, a second part 108 of the light output of the lamp 95 is emitted to a third region 109 by means of a belt lens 110 and a projector mirror 112.

The second light part 108 is reflected from the third region 109 to a second portion 113 of the elongate second region 103. Such second portion 113 is spaced by a third portion 114 from the above mentioned first portion 102 of the elongate region 103.

A third light output part 116 is projected to the third portion 114 of the elongate second region 103 via lenses 117 and 118, and with the aid of a lamp reflector 119. By way of example, the lens 118 may be a Frenel lens or a cylindrical lens which projects a divergent sheet of light as received from the lamp 94 and belt lens 117 into a band of light at the third region 114. In practice, the divergent sheet of light and the lens 118 extend very closely to the collimated sheets of light projected from the regions 101 and 109 onto the first and second regions 102 and 113. In other words, the first, second and third light outputs are projected so as to form after collimation at the regions 101 and 109 and after collimation with the lens 118, an essentially uniform band of light extending across the region 103 or across a light gate assembly 121.

By way of example, a curved mirror 123 reflects and collimates the first light output part 100 at the region 101, while a curved mirror 124 reflects and collimates the second light output part 108 at the region 109.

The mirrors 123 and 124 are concavely curved and symmetrical relative to each other.

The elongate light gate assembly 121 is mounted on the baseplate 93 for illumination by the continuous band of light provided along the second elongate region 103. The assembly 121 has a light gate structure 93 contained in a mount 126 positioned on the base 93.

By way of example, the light gate structure employed in FIGS. 8 and 9 may comprise any of the light gate structures shown in FIGS. 2 to 6, with leads 43 and 44 symbolizing means for selectively energizing light gate regions or light gates.

The light gate assembly 121 also includes the conventional crossed light polarizer plates comprising a polarizer 128 and an analyzer 129 between which the solid-state light gate structure 39 is positioned. According to FIG. 8, the assembly 121 also includes two elongate cylinder lenses 131 and 132 mounted in tandem to provide a recording lens system having a short focal length and low aberrations.

The assembly 121 thus projects selectively gated light onto light-sensitive paper or another recording medium 134 which is advanced relative to the light gate assembly via a drum 135 driven by a motor 136. By way of example, FIG. 9 shows an oscillograph trace 138 recorded in this manner with the aid of the solidstate light gate structure 39.

Of course, the utilization of the electrode and light gate structures herein disclosed in the apparatus shown in FIGS. 8 and 9 represents just an example of their broad utility.

The subject extensive disclosure will render apparent and suggest to those skilled in the art various modifications and variations within the spirit and scope of the subject invention.

I claim:

1. In a method of increasing feasible electrode density in electrode structures having spaced parallel electrodes on a substrate having spaced parallel edges, the improvement comprising in combination the steps of:

subdividing said spaced parallel electrodes into first and second electrode arrays alternating with each other along an elongate region of said substrate between said spaced parallel edges;

allocating to each of said electrode arrays a plurality of said electrodes;

providing on one side of said elongate region of the substrate first individual terminals for the electrodes in each first electrode array;

spacing any first individual terminal of any one of the electrodes in any of said first electrode arrays from the first individual terminal of any other electrode in the particular first electrode array by a center-to-center distance greater than the center-to-center spacing between said one electrode and said other electrode, while arranging said first individual terminals side by side along one of said parallel edges to provide each first individual terminal with an individual connecting lead path being free of any other terminal and intersecting a plane extending at right angles to said substrate through said one of said parallel edges for connection of a lead to the particular first terminal;

providing on the other side of the elongate region of the substrate second individual terminals for the electrodes in each second electrode array; and spacing any second individual terminal of any one of the electrodes in any one of said second electrode arrays from the second individual terminal of any other electrode in the particular second electrode array by a center-to-center distance greater than the center-to-center spacing between the latter one electrode and the latter other electrode, while arranging said second individual terminals side by side along the other of said parallel edges to provide each second individual terminal with an individual connecting lead path being free of any other terminal and intersecting a plane extending at right angles to said substrate through the other of said parallel edges for connection of a lead to the particular second individual terminal.

2. A method as claimed in claim 1, wherein:

the step of allocating to each of said electrode arrays a plurality of said electrodes includes the step of allocating to each electrode array eight electrodes;

the step of providing first individual terminals includes the step of providing for the eight electrodes in each first electrode array eight first individual terminals; and the step of providing second individual terminals includes the step of providing for the eight electrodes in each second electrode array eight second individual terminals.

3. In a method of increasing feasible electrode density in electrode structures having spaced parallel interdigitated first and second electrodes on a substrate having spaced parallel edges, the improvement comprising in combination the steps of:

subdividing said spaced parallel interdigitated first and second electrodes into first and second electrode arrays alternating with each other along an elongate region of said substrate between said spaced parallel edges;

allocating to each of said electrode arrays a plurality of said first electrodes and a plurality of said second electrodes;

providing for each plurality of first electrodes in each first electrode array a first common electrode located at a first side of said elongate region;

providing for each plurality of first electrodes in each second electrode array a second common electrode located at an opposite second side of said elongate region;

providing terminal means for said first and second common electrodes;

providing on said second side of said elongate region of the substrate first individual terminals for the second electrodes in each first electrode array;

spacing any first individual terminal of any one of the second electrodes in any of said first electrode arrays from the first individual terminal of any other second electrode in the particular first electrode array by a center-to-center distance greater than the center-to-center spacing between said one second electrode and said other second electrode, while arranging said first individual terminals side by side along one of said parallel edges to provide each first individual terminal with an individual connecting lead path being free of any other terminal and intersecting a plane through said one of said parallel edges for connection of a lead to the particular first terminal;

providing on said first side of the elongate region of the substrate second individual terminals for the second electrodes in each second electrode array;

spacing any second individual terminal of any one of the second electrodes in any one of said second electrode arrays from the second individual terminal of any other second electrode in the particular second electrode array by a center-to-center distance greater than the center-to-center spacing between the latter one second electrode and the latter other second electrode, while arranging said second individual terminals side by side along the other of said parallel edges to provide each second individual terminal with an individual connecting lead path being free of any other terminal and intersecting a plane through said other of said parallel edges for connection of a lead to the particular second individual terminal.

4. A method as claimed in claim 3, wherein:
the step of allocating to each of said electrode arrays a plurality of said first electrodes and a plurality of said second electrodes includes the step of allocating to each electrode array eight second electrodes;
the step of providing first individual terminals includes the step of providing for the eight second electrodes in each first electrode array eight first individual terminals; and
the step of providing second individual terminals includes the step of providing for the eight second electrodes in each second electrode array eight second individual terminals.

5. A method as claimed in claim 1, 2, 3 or 4, including the step of:
providing an electrically switchable light gate structure by providing said substrate with electrooptically active solid state material.

6. In a method of providing an electrically switchable light gate structure having spaced parallel electrodes on a substrate having spaced parallel edges and including electrooptically active solid state material, the improvement comprising in combination the steps of:
subdividing said spaced parallel electrodes into first and second electrode arrays alternating with each other along an elongate region of said substrate between said spaced parallel edges;
allocating to each of said electrode arrays a plurality of said electrodes and arranging electrodes in each array into electrode groups of at least two electrodes per group;
providing on one side of said elongate region of the substrate first individual terminals for the electrode groups in each first electrode array;
spacing any first individual terminal of any one of the electrode groups in any of said first electrode arrays from the first individual terminal of any other electrode group in the particular first electrode array by a center-to-center distance greater than the center-to-center spacing between said one electrode group and said other electrode group, while arranging said first individual terminals side by side along one of said parallel edges to provide each first individual terminal with an individual connecting lead path being free of any other terminal and intersecting a plane through said one of said parallel edges for connection of a lead to the particular first terminal;
providing on the other side of the elongate region of the substrate second individual terminals for the electrode groups in each second electrode array;
spacing any second individual terminal of any one of the electrode groups in any one of said second electrode arrays from the second individual terminal of any other electrode group in the particular second electrode array by a center-to-center distance greater than the center-to-center spacing between the latter one electrode group and the latter other electrode group, while arranging said second individual terminals side by side along the other of said parallel edges to provide each second individual terminal with an individual connecting lead path being free of any other terminal and intersecting a plane through the other of said parallel edges for connection of a lead to the particular second individual terminal.

7. In a method of providing an electrically switchable light gate structure having spaced parallel interdigitated first and second electrodes on a substrate having spaced parallel edges and including electrooptically active solid state material, the improvement comprising in combination the steps of:
subdividing said spaced parallel interdigitated first and second electrodes into first and second electrode arrays alternating with each other along an elongate region of said substrate between said spaced parallel edges;
allocating to each of said electrode arrays a plurality of said first electrodes and a plurality of said second electrodes and arranging the second electrodes in each array into electrode groups of at least two electrodes per group;
providing for each plurality of first electrodes in each first electrode array a first common electrode located at a first side of said elongate region;
providing for each plurality of first electrodes in each second electrode array a second common electrode located at an opposite second side of said elongate region;
providing terminal means for said first and second common electrodes;
providing on said second side of said elongate region of the substrate first individual terminals for the electrode groups in each first electrode array;
spacing any first individual terminal of any one of the electrode groups in any of said first electrode arrays from the first individual terminal of any other electrode group in the particular first electrode array by a center-to-center distance greater than the center-to-center spacing between said one electrode group and said other electrode group, while arranging said first individual terminals side by side along one of said parallel edges to provide each first individual terminal with an individual connecting lead path being free of any other terminal and intersecting a plane through said one of said parallel edges for connection of a lead to the particular first terminal;
providing on said first side of the elongate region of the substrate second individual terminals for the electrode groups in each second electrode array;
spacing any second individual terminal of any one of the electrode groups in any one of said second electrode arrays from the second individual terminal of any other electrode group in the particular second electrode array by a center-to-center distance greater than the center-to-center spacing between the latter one electrode group and the latter other electrode group, while arranging said second individual terminals side by side along the other of said parallel edges to provide each second individual terminal with an individual connecting lead path being free of any other terminal and intersecting a plane through said other of said parallel edges for connection of a lead to the particular second individual terminal.

8. A method as claimed in claim 6 or 7, including the steps of:
providing each electrode array with eight of said electrode groups;
providing eight of said first individual terminals for the eight electrode groups in each first electrode array; and
providing eight of said second individual terminals for the eight electrode groups in each second electrode array.

9. A method as claimed in claim 1, 3, 6 or 7, including the steps of:
aligning said first individual terminals for each of said first electrode arrays along a first line; and
aligning said second individual terminals for each of said second electrode arrays along a second line.

10. A method as claimed in claim 1, 3, 6 or 7, including the steps of:
aligning said first individual terminals for each of said first electrode arrays along a first line parallel to said edges; and
aligning said second individual terminals for each of said second electrode arrays along a second line parallel to said edges.

11. In a method of increasing feasible electrode density in electrode structures having spaced parallel interdigitated first and second electrodes on a substrate, the improvement comprising in combination the steps of:
subdividing said spaced parallel interdigitated first and second electrodes into first and second electrode arrays alternating with each other along an elongate region of said substrate;
allocating to each of said electrode arrays a plurality of said first electrodes and a plurality of said second electrodes;
providing for each plurality of first electrodes in each first electrode array a first common electrode located at a first side of said elongate region;
providing for each plurality of first electrodes in each second electrode array a second common electrode located at an opposite second side of said elongate region;
providing terminal means for said first and second common electrodes;
providing an individual terminal for each of said second electrodes;
spacing any individual terminal of any one second electrode from any other individual terminal of any adjacent second electrode by a center-to-center distance greater than the center-to-center spacing between said one second electrode and said adjacent second electrode;
aligning the individual terminals of the second electrodes in each of said first electrode arrays along a first line on said second side of the elongate region of the substrate; and
aligning the individual terminals of the second electrodes in each of said second electrode arrays along a second line on said first side of the elongate region.

12. A method as claimed in claim 11, including the steps of:
subdividing said terminal means for the first and second common electrodes into first terminal means for first common electrodes and second terminal means for second common electrodes;
aligning said second terminal means for second common electrodes along said first line on said second side of said elongate region of said substrate; and
aligning said first terminal means for first common electrodes along said second line on said first side of the elongate region.

13. A method as claimed in claim 11, including the steps of:
aligning the terminal means for first common electrodes along a third line different from said first and second lines and located on said first side of said elongate region.

14. A method as clamed in claim 11, including the steps of:
subdividing said terminal means for said first and second common electrodes into first terminal means for first common electrodes and second terminal means for second common electrodes;
aligning first terminal means for the first common electrodes along a third line different from said first and second lines on said first side of said elongate region; and
aligning second terminal means for the second common electrodes along a fourth line different from said first, second and third lines and located on said second side of said elongate region.

15. In a method of increasing feasible electrode density in electrode structures having spaced parallel interdigitated first and second electrodes in a light gate structure including electrooptically active solid state material, the improvement comprising in combination the steps of:
subdividing said spaced parallel interdigitated first and second electrodes into first and second electrode arrays alternating with each other along an elongate region of said light gate structure;
allocating to each of said electrode arrays a plurality of said first electrodes and a plurality of said second electrodes;
providing for each plurality of first electrodes in each first electrode array a first common electrode located at a first side of said elongate region;
providing for each plurality of first electrodes in each second electrode array a second common electrode located at an opposite second side of said elongate region;
providing terminal means for said first and second common electrodes;
providing an individual terminal for each of said second electrodes;
spacing any individual terminal of any one second electrode from any other individual terminal of any adjacent second electrode by a center-to-center distance greater than the center-to-center spacing between said one second electrode and said adjacent second electrode;
aligning the individual terminals of the second electrodes in each of said first electrode arrays along a first line on said second side of the elongate region of the substrate; and
aligning the individual terminals of the second electrodes in each of said second electrode arrays along a second line on said first side of the elongate region.

16. A method as claimed in claim 15, including the steps of:
subdividing said terminal for the first and second common electrodes into first terminal means for first common electrodes and second terminal means for second common electrodes;

aligning said second terminal means for second common electrodes along said first line on said second side of said elongate region of said structure; and aligning said first terminal means for first common electrodes along said second line on said first side of the elongate region.

17. A method as claimed in claim 15, including the steps of:

aligning terminal means for first common electrodes along a third line different from said first and second lines and located on said first side of said elongate region.

18. A method as claimed in claim 15, including the steps of:

subdividing said terminal means for said first and second common electrodes into first terminal means for first common electrodes and second terminal means for second common electrodes;

aligning first terminal means for the first common electrodes along a third line different from said first and second lines and located on said second side of said elongate region; and aligning second terminal means for the second common electrodes along a fourth line different from said first, second and third lines and located on said second side of said elongate region.

19. In a method of increasing feasible electrode density in electrode structures having spaced parallel electrodes on a substrate, the improvement comprising in combination the steps of:

subdividing said spaced parallel electrodes into first and second electrode arrays alternating with each other along an elongate region of said substrate;

allocating to each of said electrode arrays a plurality of said electrodes; providing individual terminals for said electrodes;

spacing any individual terminal of any one of said electrodes from the individual terminal of any other electrode by a center-to-center distance greater than the center-to-center spacing between said one electrode and said other electrode;

distributing the individual terminals of the electrodes in each of said first electrode arrays along a line on one side of the elongate region of the substrate; and distributing the individual terminals of the electrodes in each of said second electrode arrays along a line on the other side of the elongate region.

20. In a method of increasing feasible electrode density in electrode structures having spaced parallel interdigitated first and second electrodes on a substrate, the improvement comprising in combination the steps of:

subdividing said spaced parallel interdigitated first and second electrodes into first and second electrode arrays alternating with each other along an elongate region of said substrate;

allocating to each of said electrode arrays a plurality of said first electrodes and a plurality of said second electrodes;

providing individual terminals for said second electrodes;

spacing any individual terminal of any one of said second electrodes from the individual terminal of any other second electrode by a center-to-center distance greater than the center-to-center spacing between said one second electrode and said other second electrode;

distributing the individual terminals of the second electrodes in each of said first electrode arrays along a line on one side of the elongate region of the substrate;

distributing the individual terminals of the second electrodes in each of said second electrode arrays along a line on the other side of the elongate region; and providing terminal means for said first electrodes.

21. In a method of providing an electrically switchable light gate structure having spaced parallel electrodes on a substrate including electrooptically active solid state material, the improvement comprising in combination the steps of:

subdividing said spaced parallel electrodes into first and second electrode arrays alternating with each other along an elongate region of said substrate;

allocating to each of said electrode arrays a plurality of said electrodes and arranging electrodes in each array into electrode groups of at least two electrodes per group;

providing an individual terminal for each electrode group;

spacing any individual terminal of any one of said electrode groups from the individual terminal of any other electrode group by a center-to-center distance greater than the center-to-center spacing between said one electrode group and said other electrode group;

distributing the individual terminals of the electrode groups in each of said first electrode arrays along a line on one side of the elongate region of the substrate; and distributing the individual terminals of the electrode groups in each of said second electrode arrays along a line on the other side of the elongate region.

22. In a method of providing an electrically switchable light gate structure having spaced parallel interdigitated first and second electrodes on a substrate including electrooptically active solid state material, the improvement comprising in combination the steps of:

subdividing said spaced parallel interdigitated first and second electrodes into first and second electrode arrays alternating with each other along an elongate region of said substrate; allocating to each of said electrode arrays a plurality of said first electrodes and a plurality of said second electrodes and arranging the second electrodes in each array into at least two distinct electrode groups per array;

providing an individual terminal for each electrode group;

spacing any individual terminal of any one of said electrode groups from the individual terminal of any other electrode group by a center-to-center distance greater than the center-to-center spacing between said one electrode group and said other electrode group;

distributing the individual terminals of the electrode groups in each of said first electrode arrays along a line on one side of the elongate region of the substrate;

distributing the individual terminals of the electrode groups in each of said second electrode arrays along a line on the other side of the elongate region; and providing terminal means for said first electrodes.

23. An article of manufacture comprising in combination:

a substrate having spaced parallel edges; spaced parallel electrodes subdivided on said substrate into first and second electrode arrays alternating with each other along an elongate region of said substrate between said spaced parallel edges, with each of said first and second electrode arrays including a plurality of said electrodes;

means for individually connecting the electrodes in each first electrode array to circuity along individual connecting lead paths intersecting a plane through one of said parallel edges, including first individual terminals for the electrodes in each first electrode array arranged side by side on one side of said elongate region of the substrate along said one parallel edge, whereby each first individual terminal has an individual connecting lead path to said one parallel edge free of any other terminal, with any first individual terminal of any one of the electrodes in any of said first electrode arrays being spaced from the first individual terminal of any other electrode in the particular first electrode array by a center-to-center distance greater than the center-to-center spacing between said one electrode and said adjacent electrode; and means for individually connecting the electrodes in each second electrode array to circuitry along individual connecting lead paths intersecting a plane through the other of said parallel edges, including second individual terminals for the electrodes in each second electrode array arranged side by side on ther other side of said elongate region of the substrate along said other parallel edge, whereby each second individual terminal has an individual connecting lead path to said other parallel edge free of any other terminal, with any second individual terminal of any one of the electrodes in any of said second electrode arrays being spaced from the individual terminal of any other electrode in the particular second electrode array by a center-to-center distance greater than the center-to-center spacing between the latter one electrode and the latter other electrode.

24. An article as claimed in claim 23, wherein:

each of said first electrode arrays includes eight electrodes connected to eight of said first individual terminals; and each of said second electrode arrays includes eight electrodes connected to eight of said second individual terminals.

25. An article of manufacture comprising in combination:

a substrate having spaced parallel edges; first and second electrode arrays alternating with each other along an elongate region of said substrate between said spaced parallel edges;

each first electrode array having a plurality of first electrodes and a plurality of second electrodes, with said first and second electrodes of each first electrode array being parallel to, and spaced from, each other and interdigitated along part of said elongate region;

a first common electrode for the first electrodes in each first electrode array, located at a first side of said elongate region;

means for individually connecting the second electrodes in each first electrode array to circuitry along individual connecting lead paths intersecting a plane through one of said parallel edges, including first individual terminals for the second electrodes in each first electrode array arranged side by side on an opposite second side of said elongate region of the substrate along said one parallel edge, whereby each first individual terminal has an individual connecting lead path to said one parallel edge free of any other terminal, with any first individual terminal of any one of the second electrodes in any of said first electrode arrays being spaced from the first individual terminal of any other second electrode in the particular first electrode array by a center-to-center distance greater than the center-to-center spacing between said one second electrode and said adjacent second electrode; and each second electrode array having a plurality of first electrodes and a plurality of second electrodes, with the latter first and second electrodes of each second electrode array being parallel to, and spaced from, each other and interdigitated along part of said elongate region;

a second common electrode for the first electrodes in each second electrode array, located at said second side of said elongate region;

terminal means for said first and second common electrodes;

means for individually connecting the second electrodes in each second electrode array to circuitry along individual connecting lead paths intersecting a plane through the other of said parallel edges, including second individual terminals for the second electrodes in each second electrode array arranged side by side on said first side of said elongate region of the substrate along said other parallel edge, whereby each second individual terminal has an individual connecting lead path to said other parallel edge free of any other terminal, with any second individual terminal of any one of the second electrodes in any of said second electrode arrays being spaced from the individual terminal of any other second electrode in the particular second electrode array by a center-to-center distance greater than the center-to-center spacing between the latter one second electrode and the latter other second electrode.

26. An article as claimed in claim 25, wherein:

each of said first electrode arrays comprises eight scond electrodes connected to eight of said first individual terminals; and each of said second electrode arrays comprises eight second electrodes connected to eight of said second individual terminals.

27. An article as claimed in claim 23, 24, 25 or 26, including:

means for providing an electrically switchable light gate structure including electrooptically active solid state material in said substrate.

28. An article of manufacture comprising in combination:

a substrate having spaced parallel edges;

spaced parallel electrodes subdivided on said substrate into first and second electrode arrays alternating with each other along an elongate region of said substrate between said spaced parallel edges, with each of said first and second electrode arrays including a plurality of said electrodes arranged in groups of at least two electrodes per group;

means for individually connecting the electrode groups in each first electrode array to circuitry along individual connecting lead paths intersecting a plane through one of said parallel edges, including first individual terminals for the electrode groups in each first electrode array arranged side by side on one side of said elongate region of the substrate along said one parallel edge, whereby each first individual terminal has an individual connecting lead path to said one parallel edge free of any other terminal, with any first individual terminal of any one of the electrode groups in any of said first electrode arrays being spaced from the first individual terminal of any other electrode group in the particular first electrode array by a center-to-center distance greater than the center-to-center spacing between said one electrode group and said adjacent electrode group; and means for individually connecting the electrode groups in each second electrode array to circuitry along individual connecting lead paths intersecting a plane through the other of said parallel edges, including second individual terminals for the electrode groups in each second electrode array arranged side by side on the other side of said elongate region of the substrate along said other parallel edge, whereby each second individal terminal has an individual connecting lead path to said other parallel edge free of any other terminal, with any second individual terminal of any one of the electrode groups in any of said second electrode arrays being spaced from the individual terminal of any other electrode group in the particular second electrode array by a center-to-center distance greater than the center-to-center spacing between the latter one electrode group and the latter other electrode group.

29. An article of manufacture comprising in combination:

a substrate having spaced parallel edges; first and second electrode arrays alternating with each other along an elongate region of said substrate between said spaced parallel edges;

each first electrode array having a plurality of first electrodes and a plurality of second electrodes arranged in groups of at least two second electrodes per group, with said first and second electrodes of each first electrode array being parallel to, and spaced from, each other and interdigitated along part of said elongate region;

a first common electrode for the first electrodes in each first electrode array, located at a first side of said elongate region;

means for individually connecting the electrode groups in each first electrode array to circuitry along individual connecting lead paths intersecting a plane through one of said parallel edges, including first individual terminals for the electrode groups in each first electrode array arranged side by side on an opposite second side of said elongate region of the substrate along said one parallel edge, whereby each first individual terminal has an individual connecting lead path to said one parallel edge free of any other terminal, with any first individual terminal of any one of the electrode groups in any of said first electrode arrays being spaced from the first individual terminal of any other electrode group in the particular first electrode array by a center-to-center distance greater than the center-to-center spacing between said one electrode group and said adjacent electrode group; and each second electrode array having a plurality of first electrodes and a plurality of second electrodes, with the latter first and second electrodes of each second electrode array being parallel to, and spaced from, each other and interdigitated along part of said elongate region;

a second common electrode for the first electrodes in each second electrode array, located at said second side of said elongate region; terminal means for said first and second common electrodes;

means for individually connecting the electrode groups in each second electrode array to circuitry along individual connecting lead paths intersecting a plane through the other of said parallel edges, including second individual terminals for the second electrode groups in each second electrode array arranged side by side on said first side of said elongate region of the substrate along said other parallel edge, whereby each second individual terminal has an individual connecting lead path to said other parallel edge free of any other terminal, with any second individual terminal of any one of the electrode groups in any of said second electrode arrays being spaced from the individual terminal of any other electrode group in the particular second electrode array by a center-to-center distance greater than the center-to-center spacing between the latter one electrode group and the latter other electrode group.

30. An article as claimed in claim 28 or 29, wherein:

each of said first electrode arrays includes eight electrode groups connected to eight of said first individual terminals; and each of said second electrode arrays includes eight electrode groups connected to eight of said second individual terminals.

31. An article as claimed in claim 23, 25, 28 or 29, wherein:

said first individual terminals for each of said first electrode arrays are on a first line; and said second individual terminals for each of said second electrode arrays on a second line.

32. An article as claimed in claim 23, 25, 28 or 29, wherein:

said first individual terminals for each of said first electrode arrays are on a first line parallel to said edges; and said second individual terminals for each of said second electrode arrays are on a second line parallel to said edges.

33. An article of manufacture comprising in combination:

a substrate; first and second electrode arrays alternating along an elongate region of said substrate; each first electrode array having a plurality of first electrodes and a plurality of second electrodes, said first and second electrodes of each first electrode array being parallel to, and spaced from, each other and interdigitated along part of said elongate region, a first common electrode for the first electrode in the particular first electrode array, said first common electrode being located at a first side of said elongate region, and an individual terminal for each of said second electrodes, any individual terminal of any one second electrode being spaced from any other individual terminal of any adjacent second electrode by a center-to-center distance greater than the center-to-center spacing between said one second electrodes and said adjacent second electrode, and the individual terminals of the second electrodes in each of said first electrode arrays being aligned along a first line on said second side of the elongate region of the substrate; each second electrode array having a plurality of first electrodes and a plurality of second electrodes, said first and second electrodes of each second electrode array being parallel to, and spaced from, each other and being interdigitated along part of said elongate region, a second common electrode for the first electrodes in the particular second electrode array, said second common electrode being located at a second side of said elongate region, and an individual terminal for each of said second electrodes, any individual terminal of any one second electrode being spaced from any other individual terminal of any adjacent second electrode by a center-to-center distance greater than the center-to-center spacing between said one second electrode and said adjacent second electrode, and the individual terminals of the second electrodes in each of said second electrode arrays being aligned along a second line on said first side of the elongate region.

34. An article as claimed in claim 33, wherein:

said terminal means for the first and second common electrodes include first terminal means for first common electrodes and second terminal means for second common electrodes;

said second terminal means for second common electrodes are aligned along said first line on said second side of said elongate region of said substrate; and said first terminal means for first common electrodes are aligned along said second line on said first side of the elongate region.

35. An article as claimed in claim 33, wherein: terminal means for first common electrodes are aligned along a third line different from said first and second lines and located on said first side of said elongate region.

36. An article as claimed in claim 33, wherein: said terminal means for said first and second common electrodes include first terminal means for first common electrodes and second terminal means for second common electrodes;

first terminal means for first common electrodes are aligned along a third line different from said first and second lines and located on said first side of said elongate region; and second terminal means for second common electrodes are aligned along a fourth line different from said first, second and third lines and located on said second side of said elongate region.

37. An article of manufacture comprising in combination:

a light gate structure including electrooptically active solid state material;

first and second electrode arrays alternating along an elongate region of said light gate structure;

each first electrode array having a plurality of first electrodes and a plurality of second electrodes, said first and second electrodes of each first electrode array being parallel to, and spaced from, each other and interdigitated along part of said elongate region, a first common electrode for the first electrodes in the particular first electrode array, said first common electrode being located at a first side of said elongate region, and an individual terminal for each of said second electrodes, any individual terminal of any one second electrode being spaced from any other individual terminal of any adjacent second electrode by a center-to-center distance greater than the center-to-center spacing between said one second electrode and said adjacent second electrode, and the individual terminals of the second electrodes in each of said first electrode arrays being aligned along a first line on said second side of the elongate region of the substrate;

each second electrode array having a plurality of first electrodes and a plurality of second electrodes, said first and second electrodes of each second electrode array being parallel to, and spaced from, each other and being interdigitated along part of said elongate region, a second common electrode for the first electrodes in the particular second electrode array, said second common electrode being located at a second side of said elongate region, and an individual terminal for each of said second electrodes, any individual terminal of any one second electrode being spaced from any other individual terminal of any adjacent second electrode by a center-to-center distance greater than the center-to-center spacing between said one second electrode and said adjacent second electrode, and the individual terminals of the second electrodes in each of said second electrode arrays being aligned along a second line on said first side of the elongate region; and terminal means for said first and second common electrodes.

38. An article as claimed in claim 37, wherein: said terminal means for the first and second common electrodes include first terminal means for first common electrodes and second terminal means for second common electrodes;

said second terminal means for second common electrodes are aligned along said first line on said second side of said elongate region of said structure; and said first terminal means for first common electrodes are aligned along said second line on said first side of the elongate region.

39. An article as claimed in claim 37, wherein:

terminal means for first common electrodes are aligned along a third line different from said first and second lines and located on said first side of said elongate region.

40. An article of claimed in claim 37, wherein:

said terminal means for said first and second common electrodes include first terminal means for first common electrodes and second teminal means for second common electrodes;

first terminal means for first common electrodes are aligned along a third line different from said first and second lines and located on said first side of said elongate region; and second terminal means for second common electrodes are aligned along a fourth line different from said first, second and third lines and located on said second side of said elongate region.

41. An article of manufacture comprising in combination:

a substrate;

spaced parallel electrodes subdivided on said substrate into first and second electrode arrays alternating along an elongate region of sid substrate, with each of said first and second electrode arrays including a plurality of said electrodes;

individual terminals for the electrodes in each first electrode array distributed along a line on one said of said elongate region of the substrate, with any individual terminal of any one of the electrodes in any of said first electrode arrays being spaced from the individual terminal of any other electrode in the particular first electrode array by a center-to-center distance greater than the center-to-center spacing between said one electrode and said other electrode; and individual terminals for the electrodes in each second electrode array distributed along a line on the opposite side of said elongate region of the substrate, with any individual terminal of any one of the electrodes in any of said second electrode arrays being spaced from the individual terminal of any other electrode in the particular second electrode array by a center-to-center distance greater than the center-to-center spacing between the latter one electrode and the latter other electrode.

42. An article of manufacture comprising in combination:

a substrate;

spaced parallel interdigitated first and second electrodes subdivided on said substrate into first and second electrode arrays alternating along an elongate region of said substrate, with each of said first and second electrode arrays including a plurality of said first and second electrodes;

individual terminals for the second electrodes in each first electrode array distributed along a line on one side of said elongat region of the substrate, with any individual terminal of any one of the second electrodes in any of said first electrode arrays being spaced from the individual terminal of any other second electrode in the particular first electrode array by a center-to-center distance greater than the center-to-center spacing between said one second electrode and said other second electrode;

individual terminals for the second electrodes in each second electrode array distributed along a line on the opposite side of said elongate region of the substrate, with any individual terminal of any one of the second electrodes in any of said second electrode arrays being spaced from the individual terminal of any other second electrode in the particular second electrode array by a center-to-center distance greater than the center-to-center spacing between the latter one electrode and the latter other electrode; and terminal means for said first electrodes.

43. An article of manufacture comprising in combination:

a substrate;

spaced parallel electrodes subdivided on said substrate into first and second electrode arrays alternating along an elongate region of said substrate, with each of said first and second electrode arrays including a plurality of said electrodes arranged in electrode groups of at least two electrodes per group;

individual terminals for the electrode groups in each first electrode array distributed along a line on one side of said elongate region of the substrate, with any individual terminal of any one of the electrode groups in any of said first electrode arrays being spaced from the individual terminal of any other electrode group in the particular first electrode array by a center-to-center distance greater than the center-to-center spacing between said one electrode group and said other electrode group; and individual terminals for the electrode groups in each second electrode array distributed along a line on the opposite side of said elongate region of the substrate, with any individual terminal of any one of the electrode groups in any of said second electrode arrays being spaced from the individual terminal of any other electrode group in the particular second electrode array by a center-to-center distance greater than the center-to-center spacing between the latter one electrode group and the latter other electrode group.

44. An article of manufacture comprising in combination:

a substrate;

spaced parallel interdigitated first and second electrodes subdivided on said substrate into first and second electrode arrays alternating along an elongate region of said substrate, with each of said first and second electrode arrays including a plurality of said first electrodes and a plurality of said second electrodes arranged in electrode groups of at least two second electrodes per group;

individual terminals for the electrode groups in each first electrode array distributed along a line on one side of said elongate region of the substrate, with any individual terminal of any one of the electrode groups in any of said first electrode arrays being spaced from the individual terminal of any other electrode group in the particular first electrode array by a center-to-center distance greater than the center-to-center spacing between said one electrode group and said other electrode group; and individual terminals for the electrode groups in each second electrode array distributed along a line on the opposite side of said elongate region of the substrate, with any individual terminal of any one of the electrode groups in any of said second electrode arrays being spaced from the individual terminal of any other electrode group in the particular second electrode array by a center-to-center distance greater than the center-to-center spacing between the latter one electrode group and the latter other electrode group.

45. An article as claimed in claim 41, 42, 43 or 44, including:

a light gate structure including an electrooptically active light gate material in said substrate.

46. In a method of providing a light gate structure, the improvement comprising in combination the steps of:

providing a substrate including electrooptically active light gate material;

providing on said substrate a plurality of interdigitated first and second electrodes defining light gate regions;

arranging pluralities of said first electrodes into first groups;

providing common terminal means for the first electrodes in each first group;

arranging said second electrodes into second groups of less second electrodes per each second group than first electrodes in each first group; and providing for each second group a terminal for the second electrodes in the particular second group, wherein more than twice as many first electrodes are provided in any first group than second electrodes in any second group.

47. In a method of providing a light gate structure, the improvement comprising in combination the steps of:

providing a substrate including electrooptically active light gate material;

providing on said substrate a plurality of interdigitated first and second electrodes defining light gate regions;

arranging pluralities of said first electrodes into first groups;

providing common terminal means for the first electrodes in each first group;

arranging said second electrodes into second groups of less second electrodes per each second group than first electrodes in each first group; and providing for each second group a terminal for the second electrodes in the particular second group, wherein each first group is provided with a number of first electrodes that is a multiple of the number of second electrodes in each second group.

48. A method as claimed in claim 46 or 47, including the step of:

uniformly spacing said first and second electrodes from each other all along said light gate structure to provide a regular pattern of light gate regions.

49. In a method of providing a light gate structure, the improvement comprising in combination the steps of:

providing a substrate including electrooptically active light gate material;

providing on said substrate a plurality of interdigitated first and second electrodes defining light gate regions;

arranging pluralities of said first electrodes into first groups;

providing common terminal means for the first electrodes in each first group;

arranging said second electrodes into second groups of less second electrodes per each second group than first electrodes in each first group; and providing for each second group a terminal for the second electrodes in the particular second group providing part of said first electrodes by extending a serpentine common electrode through said first groups; and connecting said common terminal means to said serpentine common electrode.

50. In a light gate structure, the improvement comprising in combination:

a substrate including electrooptically active light gate material;

a plurality of interdigitated first and second electrodes defining light gate regions on said substrate;

pluralities of said first electrodes being present in first groups;

said second electrodes being present in second groups of less second electrodes per each second group than first electrodes in each first group;

common terminal means for the first electrodes in each first group; and a terminal for the second electrodes in each second group, wherein the number of first electrodes in any first group is more than twice the number of second electrodes in any second group.

51. In a light gate structure, the improvement comprising in combination:

a substrate including electrooptically active light gate material;

a plurality of interdigitated first and second electrodes defining light gate regions on said substrate;

pluralities of said first electrodes being present in first groups;

said second electrodes being present in second groups of less second electrodes per each second group than first electrodes in each first group;

common terminal means for the first electrodes in each first group; and a terminal for the second electrodes in each second group wherein the number of first electrodes in each first group is a multiple of the number of second electrodes in each second group.

52. A structure as claimed in claim 50 or 51, wherein said first and second electrodes are uniformly spaced from each other along said light gate structure.

53. In a light gate structure, the improvement comprising in combination:

a substrate including electrooptically active light gate material;

a plurality of interdigitated first and second electrodes defining light gate regions on said substrate;

pluralities of said first electrodes being present in first groups;

said second electrodes being present in second groups of less second electrodes per each second group than first electrodes in each first group;

common terminal means for the first electrodes in each first group;

a terminal for the second electrodes in each second group; and a serpentine common electrode extending through said first groups along part of said first electrodes and connected to said common terminal means.

* * * * *